US011183392B2

(12) United States Patent
Lin et al.

(10) Patent No.: US 11,183,392 B2
(45) Date of Patent: *Nov. 23, 2021

(54) METHOD FOR MANUFACTURING SEMICONDUCTOR DEVICES AND STRUCTURES THEREOF

(71) Applicant: TAIWAN SEMICONDUCTOR MANUFACTURING COMPANY LTD., Hsinchu (TW)

(72) Inventors: Jiann-Horng Lin, Hsinchu (TW); Chao-Kuei Yeh, Changhua County (TW); Ying-Hao Wu, Taoyuan (TW); Tai-Yen Peng, Hsinchu (TW); Chih-Hao Chen, Hsinchu (TW); Chih-Sheng Tian, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/860,956

(22) Filed: Apr. 28, 2020

(65) Prior Publication Data
US 2020/0258754 A1 Aug. 13, 2020

Related U.S. Application Data

(63) Continuation of application No. 16/121,343, filed on Sep. 4, 2018, now Pat. No. 10,636,667.
(Continued)

(51) Int. Cl.
*H01L 21/308* (2006.01)
*H01L 21/033* (2006.01)
(Continued)

(52) U.S. Cl.
CPC ...... *H01L 21/3086* (2013.01); *H01L 21/0274* (2013.01); *H01L 21/0332* (2013.01);
(Continued)

(58) Field of Classification Search
CPC ........... H01L 21/3086; H01L 21/31144; H01L 21/0337; H01L 21/0274; H01L 21/76805;
(Continued)

(56) References Cited

U.S. PATENT DOCUMENTS 8,623,770 B1  1/2014  Gao et al.
10,340,141 B2 * 7/2019  Peng ............... H01L 21/0337
(Continued)

FOREIGN PATENT DOCUMENTS

TW  201435974 A  9/2014
TW  201703116 A  1/2017

OTHER PUBLICATIONS

Office Action, Cited References and Search Report dated Apr. 21, 2021 issued by the Taiwan Intellectual Property Office for the Taiwanese counterpart application No. 107139211.
(Continued)

*Primary Examiner* — Duy Vu N Deo
(74) *Attorney, Agent, or Firm* — WPAT, P.C., Intellectual Property Attorneys; Anthony King

(57) ABSTRACT

According to an embodiment of the present disclosure, a method of manufacturing semiconductor device includes: forming a first mandrel and a second mandrel over a mask layer; depositing a spacer layer over the first mandrel and the second mandrel; forming a line-end cut pattern over the spacer layer between the first mandrel and the second mandrel; depositing a protection layer over the line-end cut pattern; etching the protection layer and exposing upper portion of the line-end cut pattern; reducing a width of the line-end cut pattern; etching the spacer layer to expose the
(Continued)

first mandrel and the second mandrel; and patterning the mask layer using the etched spacer layer and the reduced line-end cut pattern as an etch mask.

20 Claims, 31 Drawing Sheets

Related U.S. Application Data

(60) Provisional application No. 62/589,162, filed on Nov. 21, 2017.

(51) Int. Cl.
  *H01L 21/768* (2006.01)
  *H01L 21/311* (2006.01)
  *H01L 21/027* (2006.01)

(52) U.S. Cl.
  CPC .... *H01L 21/0337* (2013.01); *H01L 21/31111* (2013.01); *H01L 21/31144* (2013.01); *H01L 21/76805* (2013.01); *H01L 21/76811* (2013.01)

(58) Field of Classification Search
  CPC ......... H01L 21/31111; H01L 21/76811; H01L 21/0332
  USPC .......................................... 438/689, 694, 696
  See application file for complete search history.

(56) References Cited

U.S. PATENT DOCUMENTS

| | | | |
|---|---|---|---|
| 10,636,667 B2* | 4/2020 | Lin | .................. H01L 21/76816 |
| 2014/0273456 A1 | 9/2014 | Shieh et al. | |
| 2015/0024597 A1 | 1/2015 | Gao et al. | |
| 2016/0300718 A1 | 10/2016 | Raley et al. | |
| 2018/0315601 A1* | 11/2018 | Peng | .................. H01L 21/0276 |

OTHER PUBLICATIONS

US20140273456A1 corresponds to TW201435974A.
US20160300718A1 corresponds to TW201703116A.

* cited by examiner

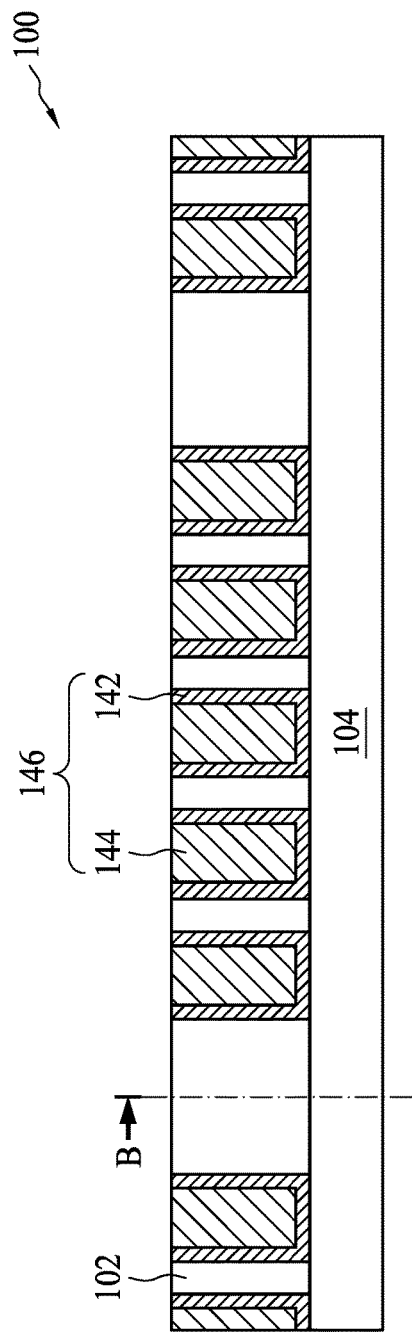
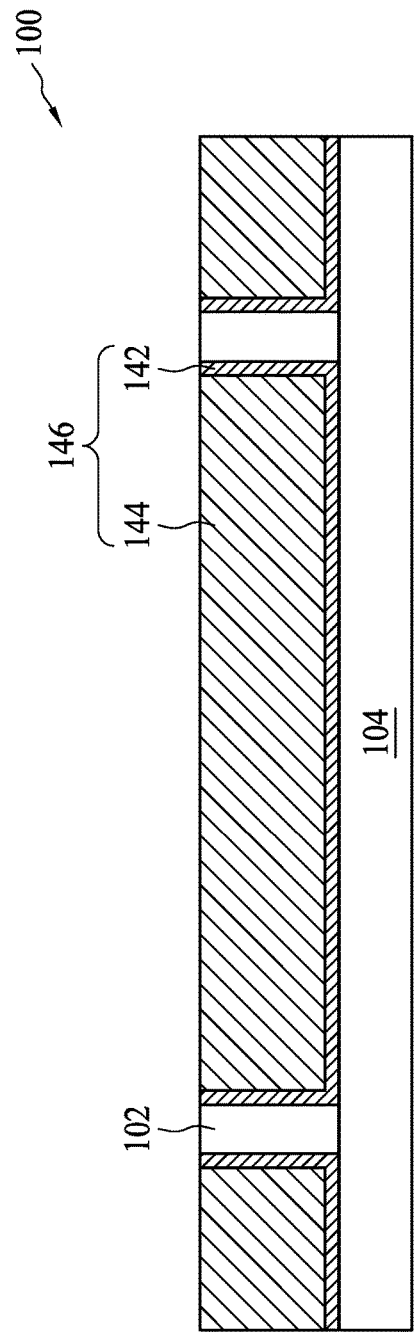
FIG. 19A
FIG. 19B

METHOD FOR MANUFACTURING SEMICONDUCTOR DEVICES AND STRUCTURES THEREOF

PRIORITY CLAIM AND CROSS-REFERENCE

This application claims priority to U.S. Provisional Application Ser. No. 62/589,162 filed Nov. 21, 2017 and U.S. application Ser. No. 16/121,343 filed Sep. 4, 2018, now U.S. Pat. No. 10,636,667, which applications are hereby incorporated by reference.

BACKGROUND

With the current trend of down-scaling of advanced semiconductor devices, processing techniques (e.g., photolithography) are adapted to allow for device features having smaller dimensions and improved accuracy. However, the processing performance (e.g., photolithographic resolution) may be prevented from achieving continuing improvement due to limitations of available fabrication technologies and equipment. Efforts have been made to extend the life cycle of purchased fabrication equipment in order to facilitate development processes and reduce expenditure. As semiconductor devices are produced in smaller and smaller sizes, the feature spacing (i.e., the pitch) of a device may be reduced to a point that may not be achievable using existing photolithography equipment and processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. Specifically, the dimensions of the various features may be arbitrarily increased or reduced for clarity of discussion.

FIGS. 17A, 17B, 18A, 18B, 19A, 19B, and 20 are schematic cross-sectional views of intermediate stages of manufacturing a semiconductor device, in accordance with some other embodiments.

DETAILED DESCRIPTION

Figure 1:
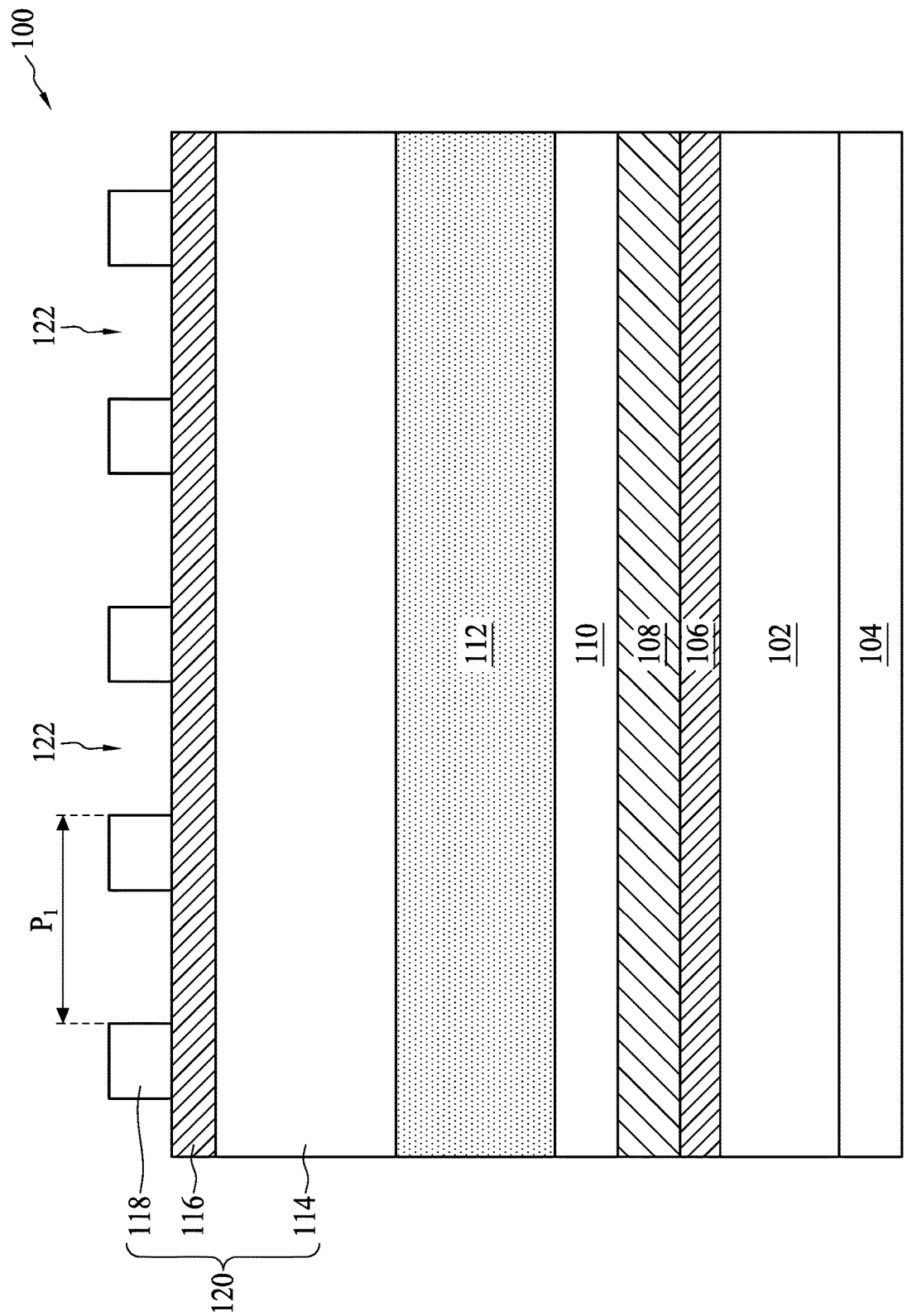
FIGS. 1-5, 6A, 6B, 7A, 7B, 8A, 8B, 9A, 9B, 10A, 10B, 11A, 11B, 12A, 12B, 13A, 13B, 14A, 14B, 15A, 15B and 16 are schematic cross-sectional views of intermediate stages of manufacturing a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure: is directed to a patterning operation for semiconductor devices. Specifically, a self-aligned double patterning (SADP) operation is introduced in which mandrels are patterned, followed by the formation of spacers along sidewalls of the mandrels. The mandrels are removed while the spacers remain and are used to define a pattern at about half a pitch of the mandrels. The abovementioned patterning operation may be performed to pattern lines in a semiconductor device. The lines patterned in this way may attain a pitch that is difficult to achieve using existing photolithographic equipment alone.

In the present disclosure, exemplary conductive lines are defined between adjacent sidewalls of spacers, and a patterned sacrificial material (sometimes referred to as a reverse material) is formed in the patterned lines. After the sacrificial material is formed, the spacers and the sacrificial material are used to pattern an underlying mask layer, which is in turn used to pattern a target layer below the mask layer. The sacrificial material as patterned in a contiguous line pattern is used to define an obstructing portion intersecting the contiguous line. The target layer patterned with the mask layer may thus contain adjacent line segments with spacing (pitch) of less than about 30 nm. Moreover, the disclosed patterning operations can be extended to other advanced photolithographic techniques, such as self-aligned quadruple patterning (SAQP) or the like, using the principles discussed in the present disclosure.

FIGS. 1-5, 6A, 6B, 7A, 7B, 8A, 8B, 9A, 9B, 10A, 10B, 11A, 11B, 12A, 12B, 13A, 13B, 14A, 14B, 15A, 15B, and 16 are schematic cross-sectional views of intermediate stages for patterning a target layer 102 in a semiconductor device 100, in accordance with some exemplary embodiments. In some embodiments, the semiconductor device 100 is processed on a larger wafer. Various features (e.g., active components, passive components, interconnect structures, and the like) may be formed on the semiconductor device 100. A die singulation operation may be applied to scribe line regions of the wafer in order to separate the wafer into individual semiconductor dies or chips, at least one of which includes the semiconductor device 100.

Among various layers of the semiconductor device 100 shown in FIG. 1, the target layer 102 is one that would remain in a finalized product of the semiconductor device 100. The target layer 102 may be processed via patterns that are to be formed and transferred thereto via other layers, as discussed in subsequent paragraphs.

Referring to FIG. 1, a substrate 104 is received or provided. The substrate 104 may be formed of a semiconductor material such as silicon, doped or undoped, or an active layer of a semiconductor-on-insulator (SOI) substrate. The substrate 104 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and GaInAsP; or combinations thereof. Other substrates, such as multi-layered or gradient substrates, may also be used. In embodiments where the target layer 102 is a semiconductor substrate of a FinFET, the substrate 104 may be omitted.

A film stack is formed over the substrate 104. In the depicted embodiment, the film stack includes a target layer 102, an anti-reflective coating (ARC) 106, a mask layer 108, a dielectric layer 110, and a mandrel layer 112.

The target layer 102 is formed over the substrate layer 104. In some embodiments, the target layer 102 is an inter-metal dielectric (IMD) layer. The MID layer 102 may contain interconnected conductive lines and vias to provide electrical connections for components in the semiconductor device 100. The target layer 102 may comprise a dielectric material electrically insulating the conductive lines and vias. The dielectric material may be a low-k material with a dielectric constant (k value) lower than 3.8, lower than about 3.0, or lower than about 2.5, for example. In alternative embodiments, the dielectric material may be a high-k dielectric material with a dielectric constant higher than 3.8. The conductive lines or vias may be formed in openings patterned in the dielectric material.

In some embodiments, the target layer 102 is formed of a conductive layer such as metal or polysilicon. Conductive features, such as conductive lines/vias or gates of a FinFET may be formed in the target layer 102 through the proposed patterning operation. The pitch of the conductive lines/vias or the gates may be reduced and gate density may be increased.

In some embodiments, the target layer 102 is a semiconductor substrate. The semiconductor substrate may be formed of a semiconductor material such as silicon, silicon germanium, or the like. In some embodiments, the semiconductor substrate is a crystalline semiconductor substrate. Various features of the semiconductor device 100, such as isolation structures, source/drain regions, fin structures, dielectric layers or contacts, may be formed through the patterning operations discussed in the present disclosure.

In some embodiments, intervening layers (not separately shown) are disposed between the target layer 102 and the substrate 104. Exemplary intervening layers include an inter-layer dielectric (ILL)) layer comprising a low-k dielectric and having contact plugs formed therein, an adhesion layer and an etch stop layer. In some embodiments, an additional MD layer is formed as another intervening layer.

The ARC 106 is formed over the target layer 102. The ARC 106 aids in the exposure and focus performance of a patterning operation when an overlying photoresist layer is subjected to an exposure radiation. In some embodiments, the ARC 106 is formed from a dielectric material, such as SiON, silicon carbide, or the like. In some embodiments, the ARC 106 is substantially free from nitrogen, and is formed from an oxide. The ARC 106 may be formed using Chemical Vapor Deposition (CVD), Physical Vapor Deposition (PVD), or the like.

The mask layer 108 is formed over the ARC 106. In some embodiments, the mask layer 108 is a hard mask. The mask layer 108 may be formed of a metallic material, such as titanium nitride, titanium, tantalum nitride, or tantalum. The mask layer 108 may be formed of metal-doped carbide (e.g., tungsten carbide) or a metalloid (e.g., silicon nitride, boron nitride or silicon carbide). The mask layer 108 may be formed using CVD, PVD, Atomic Layer Deposition (ALD), or the like. In some embodiments, the mask layer 108 is initially patterned and then the target layer 102 is etched with the mask layer 108 as an etching mask. The pattern of the mask layer 108 is transferred to the target layer 102 accordingly.

The dielectric layer 110 is formed over the mask layer 108. The dielectric layer 110 may be formed from a dielectric material, such as silicon oxide (e.g., borophosphosilicate tetraethylorthosilicate (BPTEOS) or undoped tetraethylorthosilicate (MOS) oxide). The dielectric layer 110 may be formed using CVD, ALD, spin-on coating, or the like. In some embodiments, the dielectric layer 110 acts as an etch stop layer of subsequently formed mandrels or spacer layers over the dielectric layer 110.

The mandrel layer 112 is formed over the dielectric layer 110. The first mandrel layer 112 may be formed of a semiconductor material such as amorphous silicon, polysilicon, silicon nitride, silicon oxide, or the like. In an embodiment, the underlying layer, e.g., dielectric layer 110, is selected such that a high etching selectivity between the mandrel layer 112 and the dielectric layer 110 is obtained. In some embodiments, the etching selectivity between the mandrel layer 112 and its underlying layer is between about 2.0 and about 10.0.

A photoresist stack 120 is formed over the mandrel layer 112. The photoresist stack 120 includes a bottom layer 114, a middle layer 116, and an upper layer 118. The bottom layer 114 and upper layer 118 may be formed of photosensitive materials, such as organic materials, while the middle layer 116 may comprise an inorganic material, such as nitride, oxynitride, oxide, or the like. In some embodiments, the middle layer 116 has a high etching selectivity relative to the upper layer 118 and the bottom layer 114. In some embodiments, the bottom layer 114 is a bottom anti-reflective coating (BARC) layer. Each layer of the photoresist stack 120 may be blanket deposited in sequence using spin-on coating, CVD, or other similar processes. In some embodiments, the photoresist stack 120 is a monolayer or bilayer structure in which at least one layer (such as the middle layer 116) is omitted from the photoresist stack 120. The monolayer or bilayer configuration may be used in an extreme ultraviolet (EUV) lithography operation.

Still referring to FIG. 1, a patterning operation for the mandrels 124 (see FIG. 4) begins from a patterning operation on the upper layer 118. The upper layer 118 is patterned as a first-stage etching mask. Openings 122 are formed accordingly. In some embodiments, the patterned upper layer 118 includes elongated parallel openings 122 extending perpendicular to the paper. The pitch P1 of the openings 122 may be the minimum pitch achievable using existing photolithographic processes alone. In some embodiments, the pitch P1 of the openings 122 is greater than about 80 nm. The openings 122 may be formed using an etching operation, such as a wet etch, a dry etch, or a combination thereof. In the present embodiment, a dry etch is employed to conduct anisotropic etching along normal directions with respect to the surface of the upper layer 118.

Figure 2:
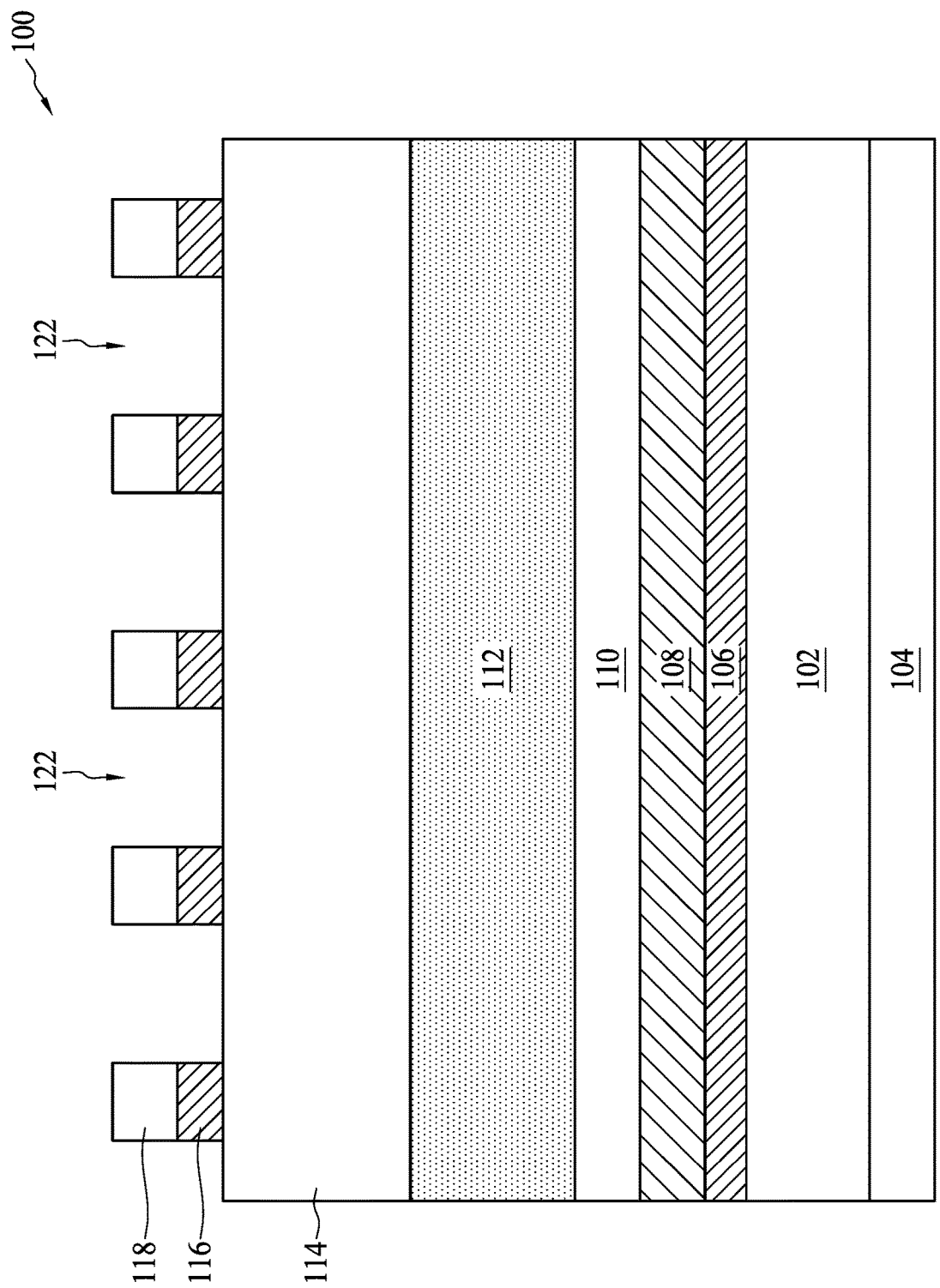
Figure 3:
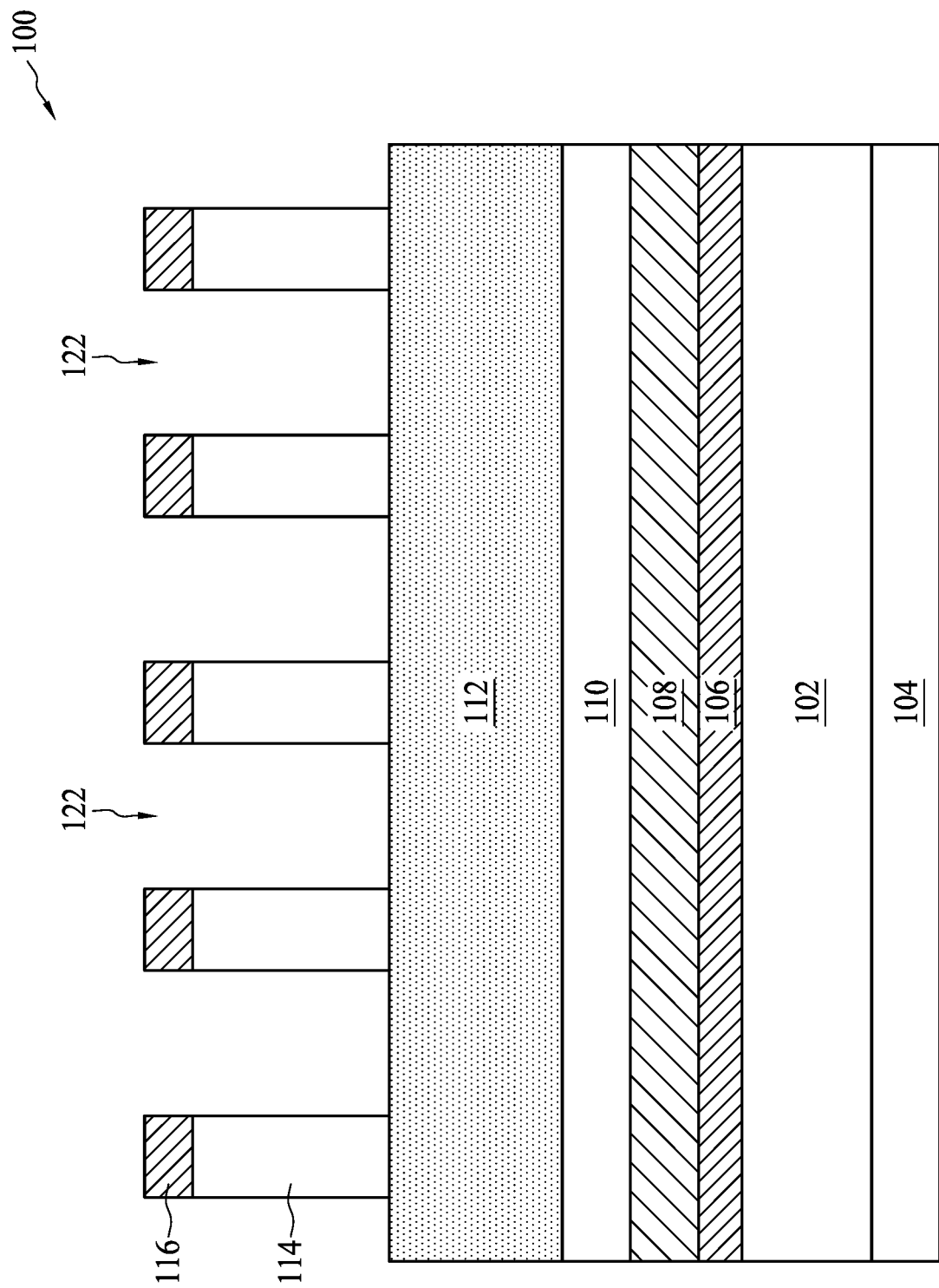

Subsequently, referring to FIG. 2, the middle layer 116 is patterned through an etching operation with the upper layer 118 as the etching mask. The middle layer 116 is then used as a second-stage etching mask for patterning of the bottom layer 114. Similarly, as demonstrated in FIG. 3, the bottom layer 114 is patterned and serves as a third-stage etching mask for patterning the mandrel layer 112.

Figure 4:
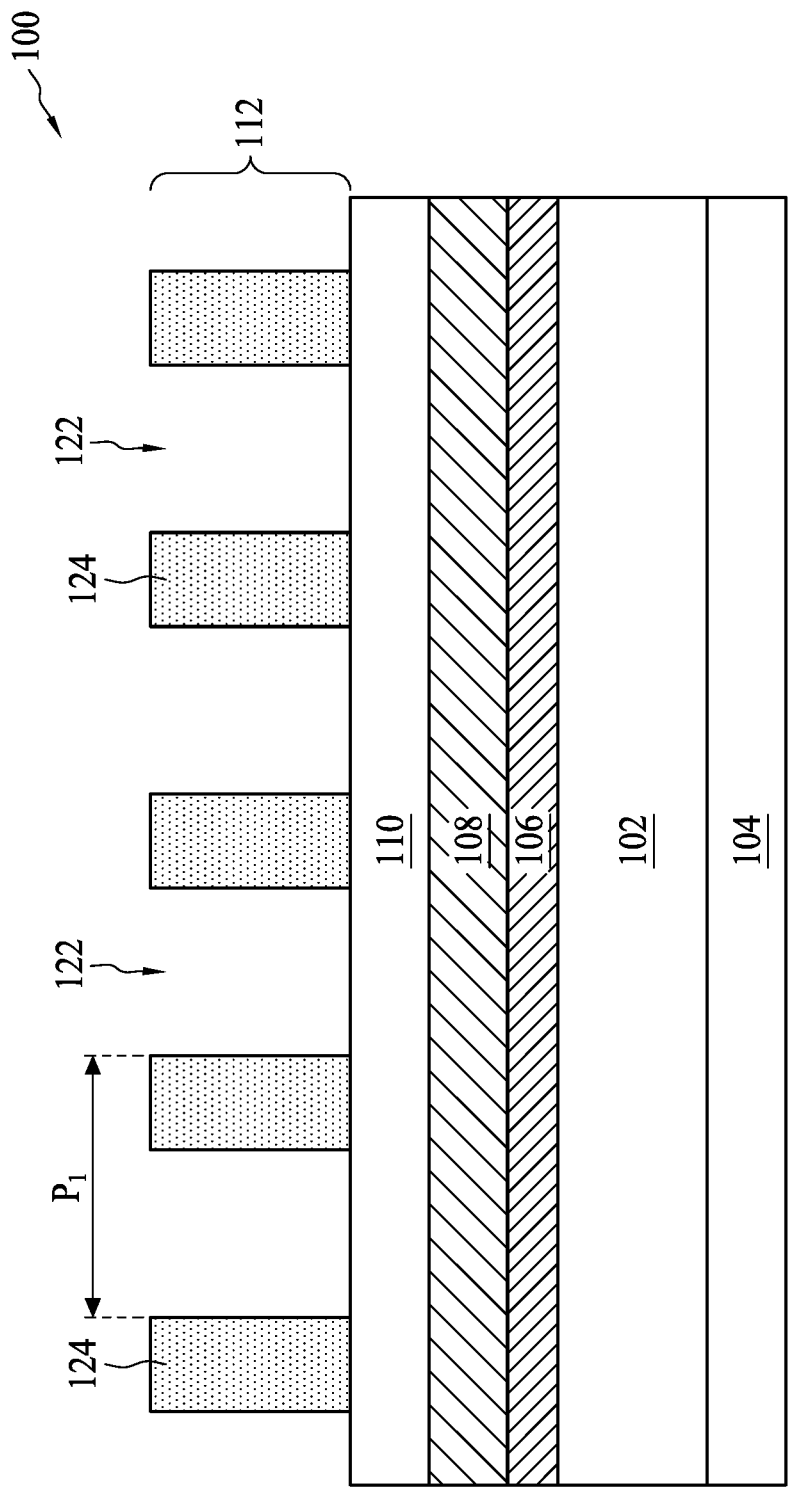

As shown in FIG. 4, the mandrel layer 112 is patterned through an etching operation with the bottom layer 114 as the etching mask. Mandrels 124 are formed over the dielectric layer 110 accordingly. In some embodiments, each of the mandrels 124 has a strip shape when viewed from above. It has been observed that the three-stage etching procedure using the photoresist stack 120 may help in etching the mandrel layer 112 with a desirable pattern-transferring performance. Referring to FIGS. 1 to 4, the pitch P1 of the openings 122 in the upper layer 118 can be successfully transferred through the middle layer 116 and the bottom layer 114 towards the mandrel layer 112. The openings 122 extend downward until the upper surface of the mandrel layer 112 is exposed and the pitch of the mandrels 124 is substantially maintained as P1.

In some embodiments, the upper layer 118 (see FIGS. 2 and 3) is completely or partially consumed during the patterning of the bottom layer 114. In some embodiments, the middle layer 116 or the bottom layer 114 (see FIGS. 3 and 4) is completely or partially consumed during the patterning of the mandrel layer 112. In some embodiments, the residues of the photoresist stack 120 (including the bottom layer 114, the middle layer 116 and the upper layer 118) are removed or stripped, for example using an ashing process, after the mandrels 124 have been formed.

Figure 5:
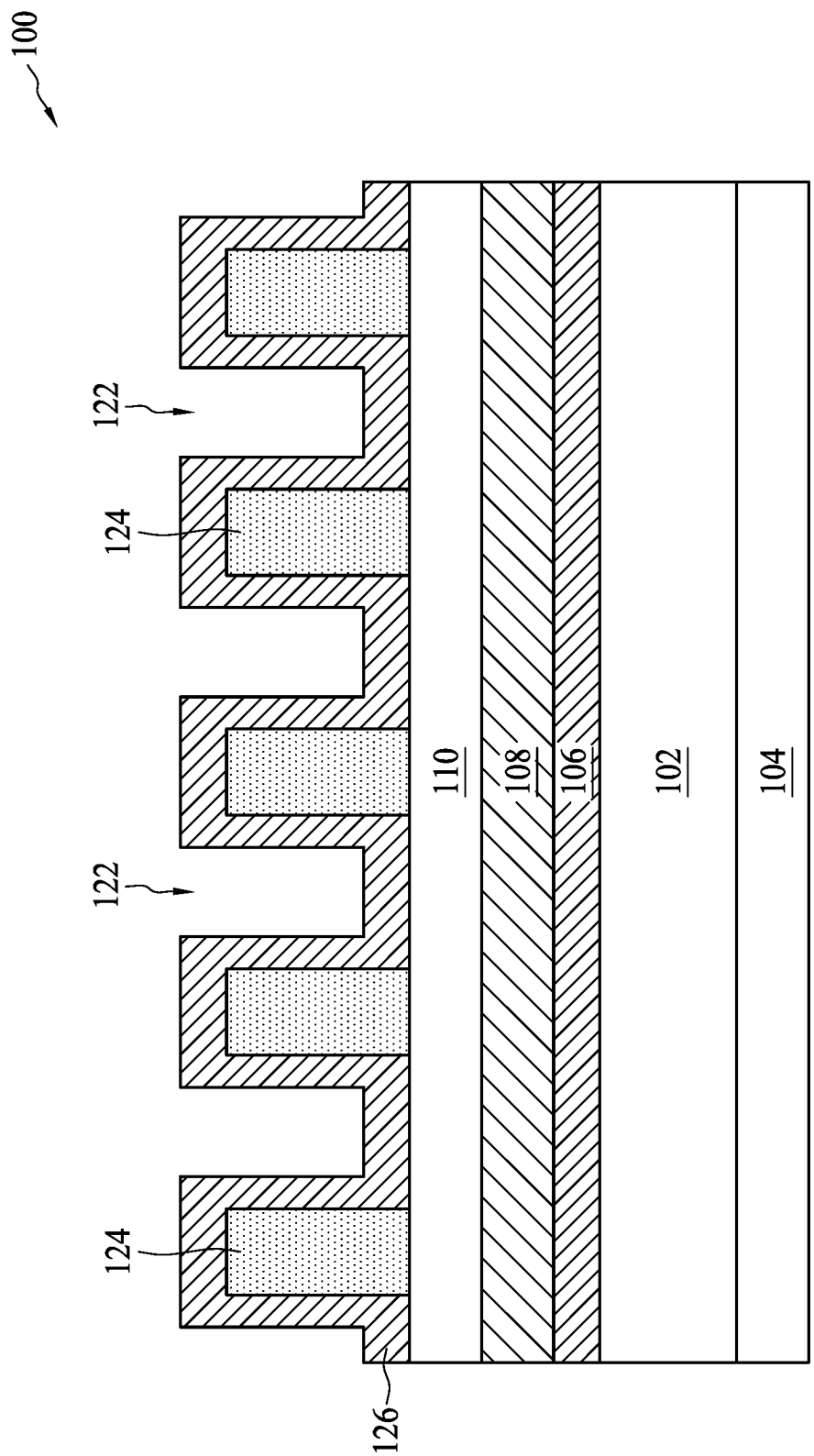

In FIG. 5, a spacer layer 126 is formed over the mandrels 124 and the dielectric layer 110. The spacer layer 126 may cover sidewalls of the mandrels 124. The material of the spacer layer 126 is selected to have a high etching selectivity between the dielectric layer 110 and mandrels 124. For example, the etching selectivity between the mandrels 124 and the dielectric layer 110 is between about 2.0 and about 8.0. The spacer layer 126 may be comprised of AlO, AlN, AlON, TaN, TiN, TiO, Si, SiO, SiN, metals, metal alloys, or the like. The spacer layer 126 may be formed using a deposition operation such as ALD, CVD, or the like. In some embodiments, the spacer layer 126 is conformally formed so that the spacer layer 126 has substantially equal thicknesses across sidewalls and top surfaces of the mandrels 124 and bottom surfaces of the openings 122. In some embodiments, the areas of the openings 122 between sidewalls of the spacer layer 126 define patterns of subsequently formed conductive lines.

The following descriptions discuss the formation of line-end cut pattern 148 (see FIGS. 12A and 12B) in the openings 122 over selected portions of the spacer layer 126. Initially a sacrificial material 138 is deposited in select areas of the line patterns. The sacrificial material 138 is then patterned to define line-end cut portion in the target layer 102. For example, the line-end cut pattern 148 is formed to define areas between line segments where conductive materials are not formed. In other words, a contiguous line is cut into spaced segments with the line-end cut portion therebetween.

Throughout FIGS. 6A, 6B, 7A, 7B, 8A, 8B, 9A, 9B, 10A, 10B, 11A, 11B, 12A, 12B, 13A, 13B, 14A, 14B, 15A and 15B, figures ending with designation "A" illustrate a same cross-sectional view as FIGS. 1 through 5, while figures ending with the designation "B" illustrate a cross-sectional view taken along line BB of a respective figure with designation "A". For example, FIG. 6B illustrates a cross-sectional view taken along line BB of FIG. 6A.

Figure 6A:
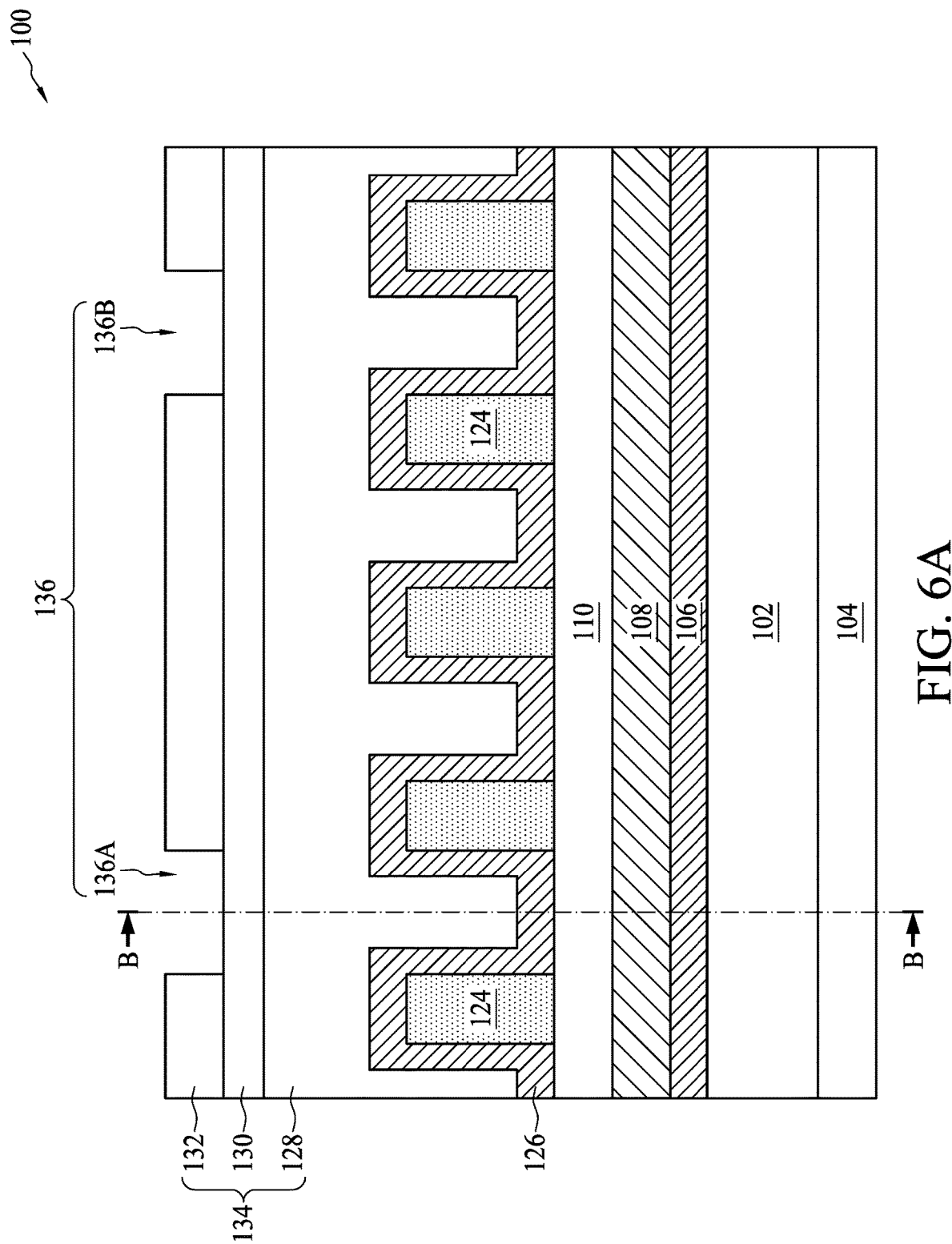
Figure 6B:
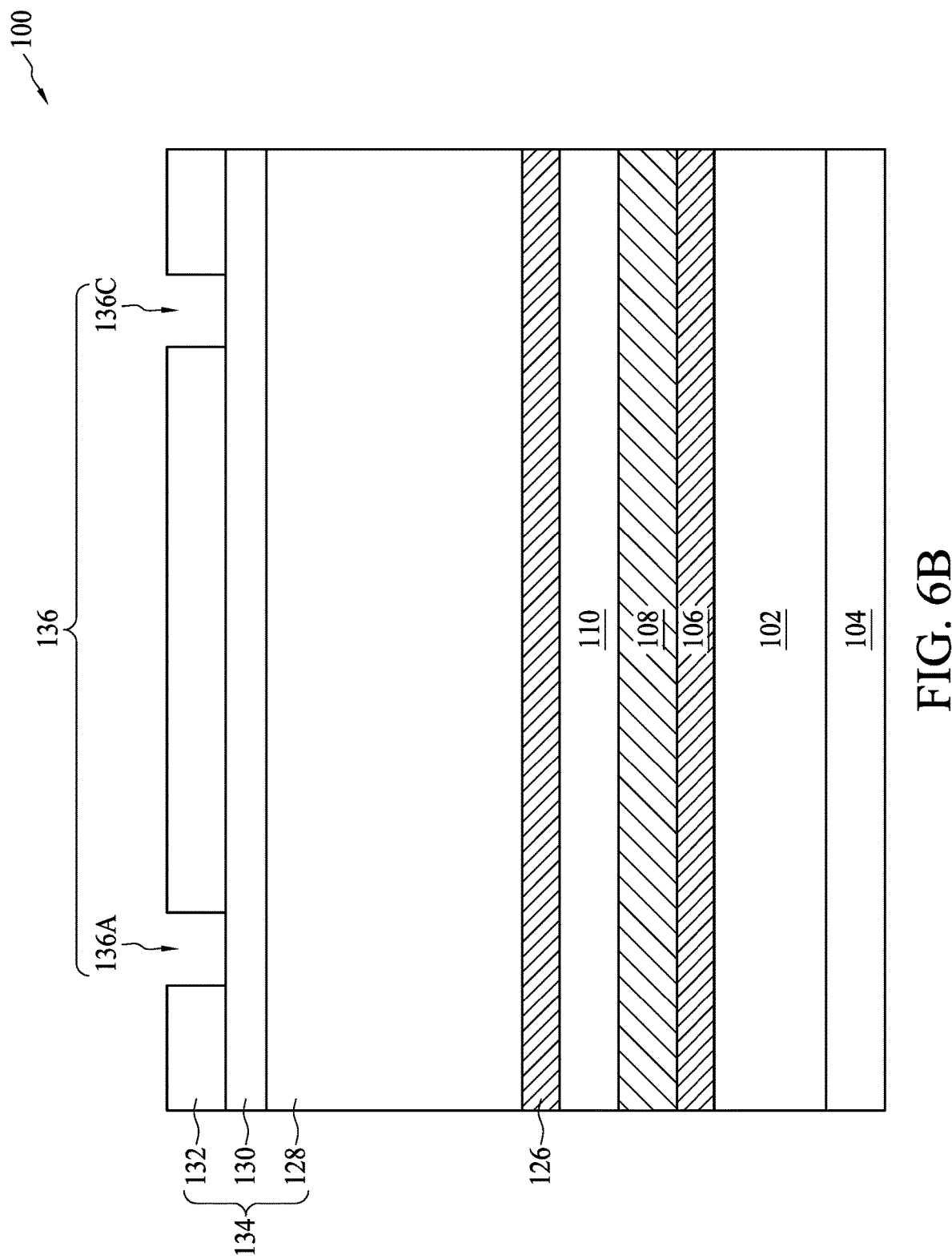

Referring to FIGS. 6A and 6B, a photoresist stack 134 is formed over the spacer layer 126. The photoresist stack 134 includes a bottom layer 128, a middle layer 130, and an upper layer 132. In some embodiments, the materials and configurations of the component layers in the photoresist 134 are similar to those of the photoresist 120. The bottom layer 128 and upper layer 132 may be formed of photosensitive materials such as organic materials. The bottom layer 128 may be deposited between mandrels 124, such as spaces for the line patterns between sidewalls of the spacer layer 126. In some embodiments, the bottom layer 128 is a BARC. The middle layer 130 may comprise an inorganic material, such as nitride, oxynitride, oxide, or the like. The middle layer 130 has a high etching selectivity relative to the upper layer 132 and the bottom layer 128. Each layer of the photoresist stack 134 may be blanket deposited in series using spin-on coating, CVD, or other similar processes.

Still referring to FIGS. 6A and 6B, a patterning operation for the line-end cut pattern 148 begins from a patterning operation on the upper layer 132. The upper layer 132 is patterned as a first-stage etching mask. Openings 136 (e.g., 136A, 136B and 136C) are formed and substantially align the corresponding openings 122 between sidewalls of the spacer layer 126. In some embodiments, the widths of the openings 136 are less than the widths of the openings 122 between the sidewalls of the spacer layer 126. The openings 136 may be formed using an etching operation, such as a wet etch, a dry etch, or a combination thereof. In the present embodiment, a dry etch is employed to conduct anisotropic etching along normal directions with respect to the surface of the upper layer 132. The openings 136A and 136B shown in 6A are formed to corresponding to different parallel openings 122 in FIG. 5, and the openings 136A and 136C shown in FIG. 6B are formed to correspond to a same opening 122. The openings 136 may have a circular shape or a polygonal shape, such as a quadrilateral shape, as demonstrated from their cross-sectional views in FIGS. 6A and 6B.

Figure 7A:
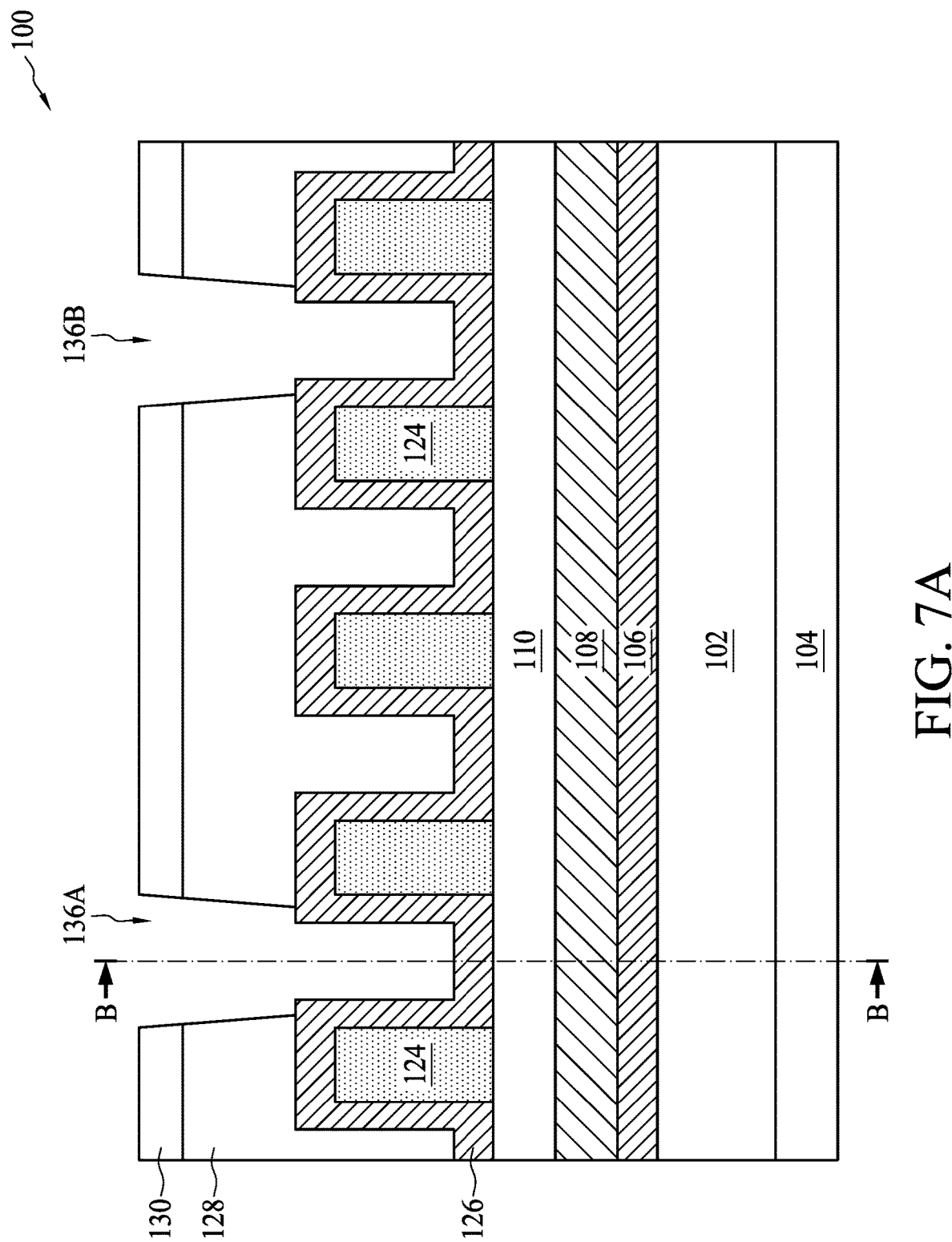
Figure 7B:
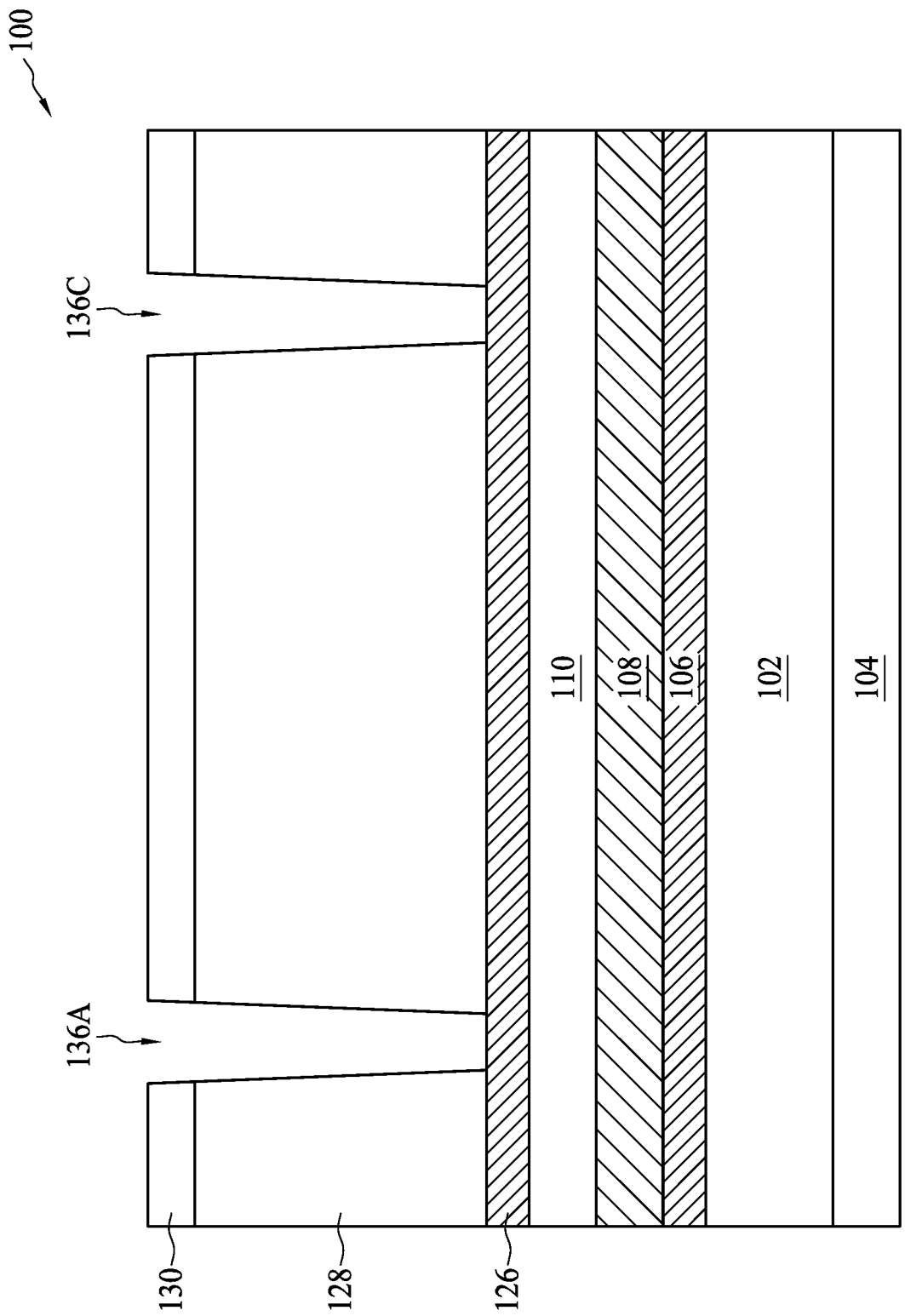

Subsequently, referring to FIGS. 7A and 7B, the middle layer 130 is patterned through an etching process with the upper layer 132 as the etching mask. The middle layer 130 is then used as a second-stage etching mask for patterning of the bottom layer 128. As shown in FIGS. 7A and 7B, the openings 136 extend through the middle layer 116 and the bottom layer 114, and expose portions of the spacer layer 126. In some embodiments, the upper layer 132 is completely or partially consumed during the patterning of the middle layer 130 and the bottom layer 128.

Figure 8A:
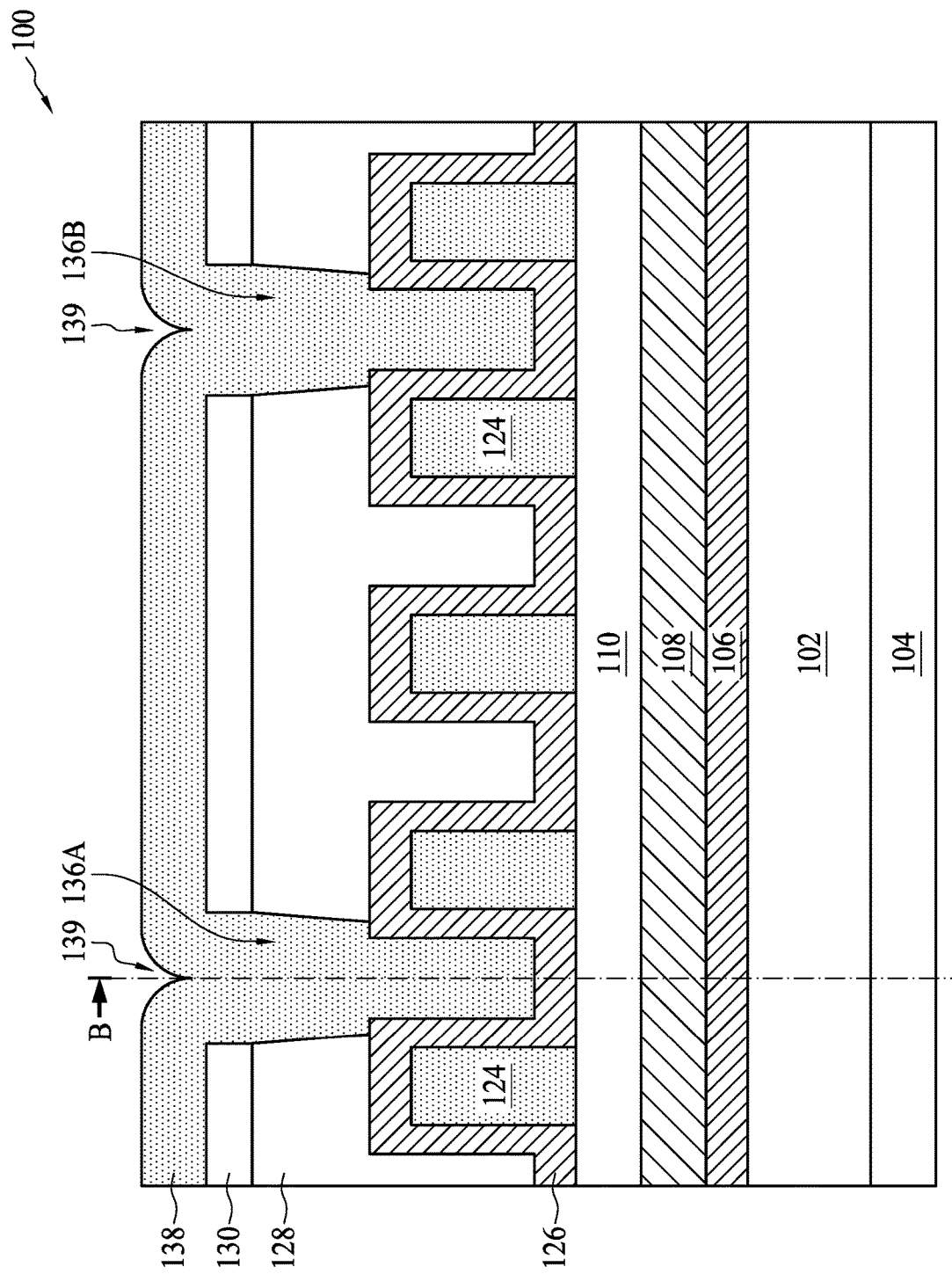
Figure 8B:
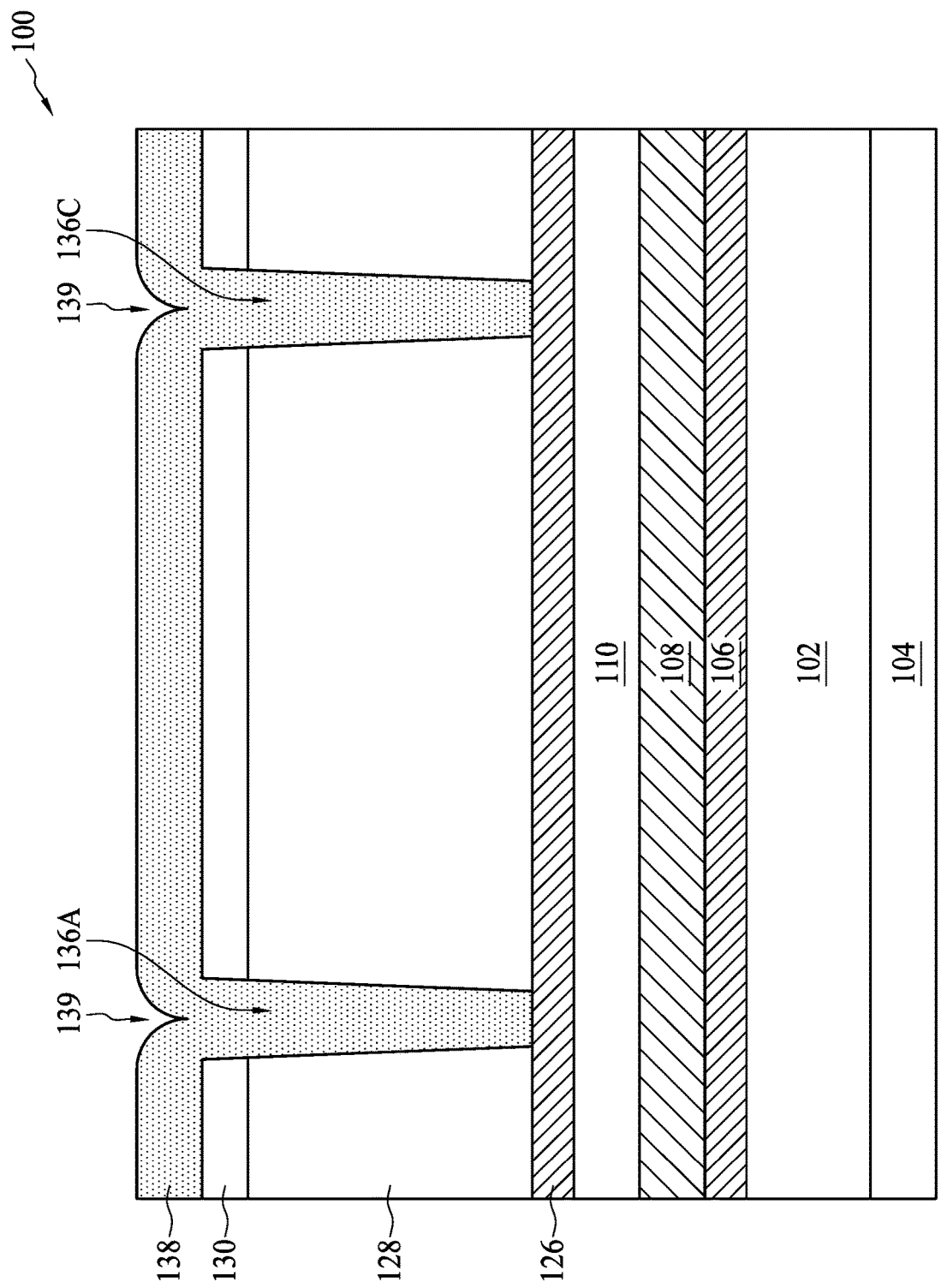

In FIGS. 8A and 8B, the sacrificial material 138 is deposited over the middle layer 130. The sacrificial material 138 may fill the openings 136. In some embodiments (not illustrated), the middle layer 130 is removed prior to depositing the sacrificial material 138. The middle layer 130 may be removed using a dry etch, a wet etch, or a combination thereof. Under that situation, the sacrificial material 138 is formed directly on an upper surface of the bottom layer 128.

In some embodiments, the sacrificial material 138 comprises an inorganic material. For example, the sacrificial material 138 is an inorganic oxide, such as titanium oxide, tantalum oxide, silicon oxide, or the like. In some embodiments, the inorganic material is a low temperature oxide (LTO). As used throughout the present disclosure, the term "LTO" refers to an oxide deposited at a relatively low process temperature (e.g., 200° C. or below). The selection of the low temperature deposition operation may help in protecting the bottom layer 128 from damage. The sacrificial material 138 may have sufficient etch selectivity with respect to the spacer layer 126 under a same etchant. For example, a ratio of an etch rate of the sacrificial material 138 to an etch rate of the spacer layer 126 with respect to a same etchant is greater than about 2. As a result, the patterning performance of the sacrificial material 138 may be better managed through appropriate selection of its material.

The sacrificial material 138 may be formed using a suitable operation, such as spin-on coating, CVD, PVD, ALD, or the like. The deposition operation may be a conformal operation, in which the sacrificial material 138 is lined along sidewalk and bottom surfaces of openings 136. In embodiments that use film deposition operations, portions of the sacrificial material 138 on opposing sidewalls in the openings 136 may merge as the deposition thickness increases, thus filling the openings 136. In some embodiments, a top surface of the sacrificial material 138 is not planar. For example, divots 139 are present in the top surface of the sacrificial material 138. Compared to spin-on processes, the film deposition operations, CVD, PVD, or ALD) allow the sacrificial material 138 to be filled in the openings 136 with improved gap-filling performance. Fewer defects (e.g., bubbles) may be introduced through the film deposition operations.

Figure 9A:
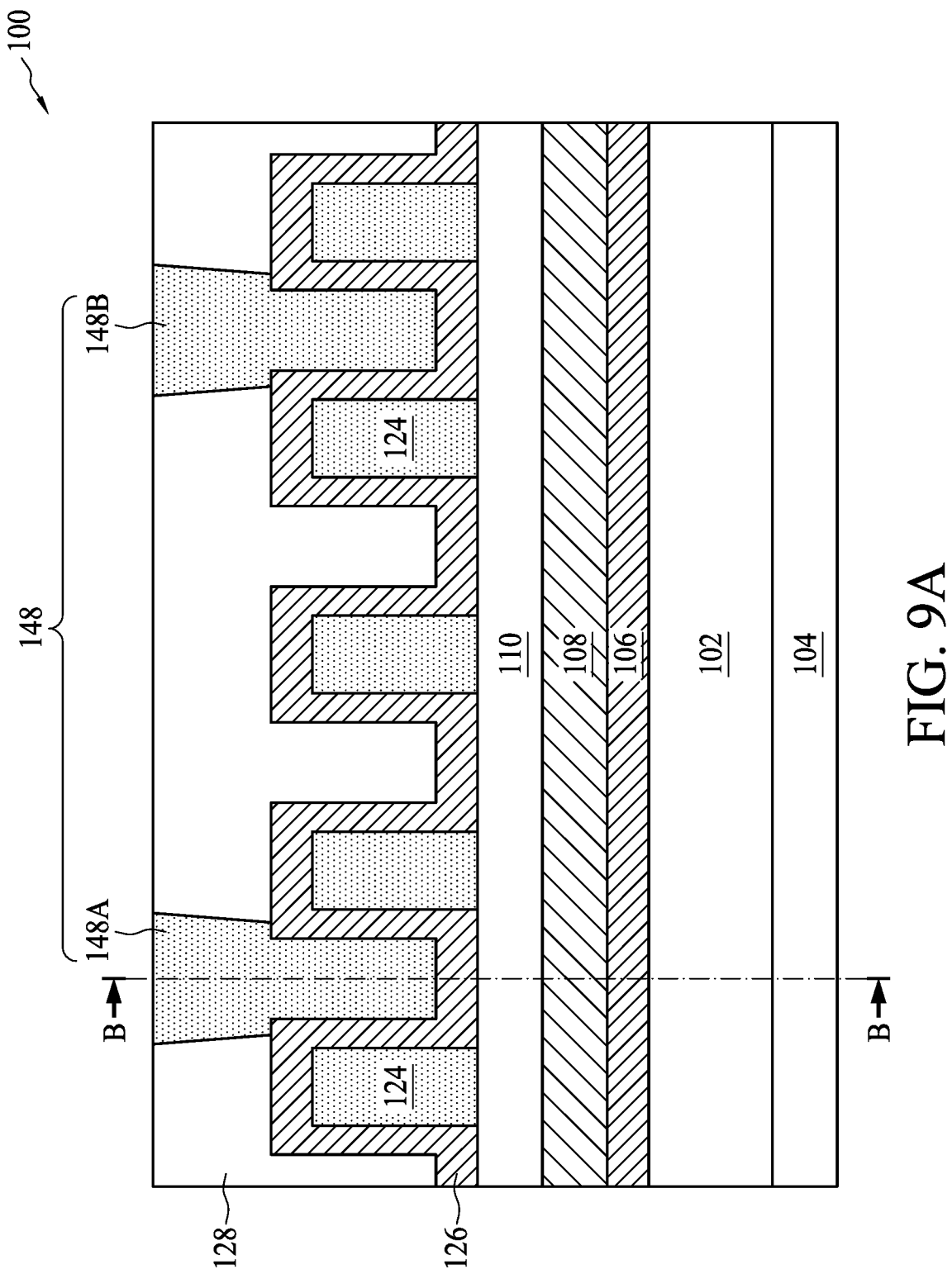
Figure 9B:
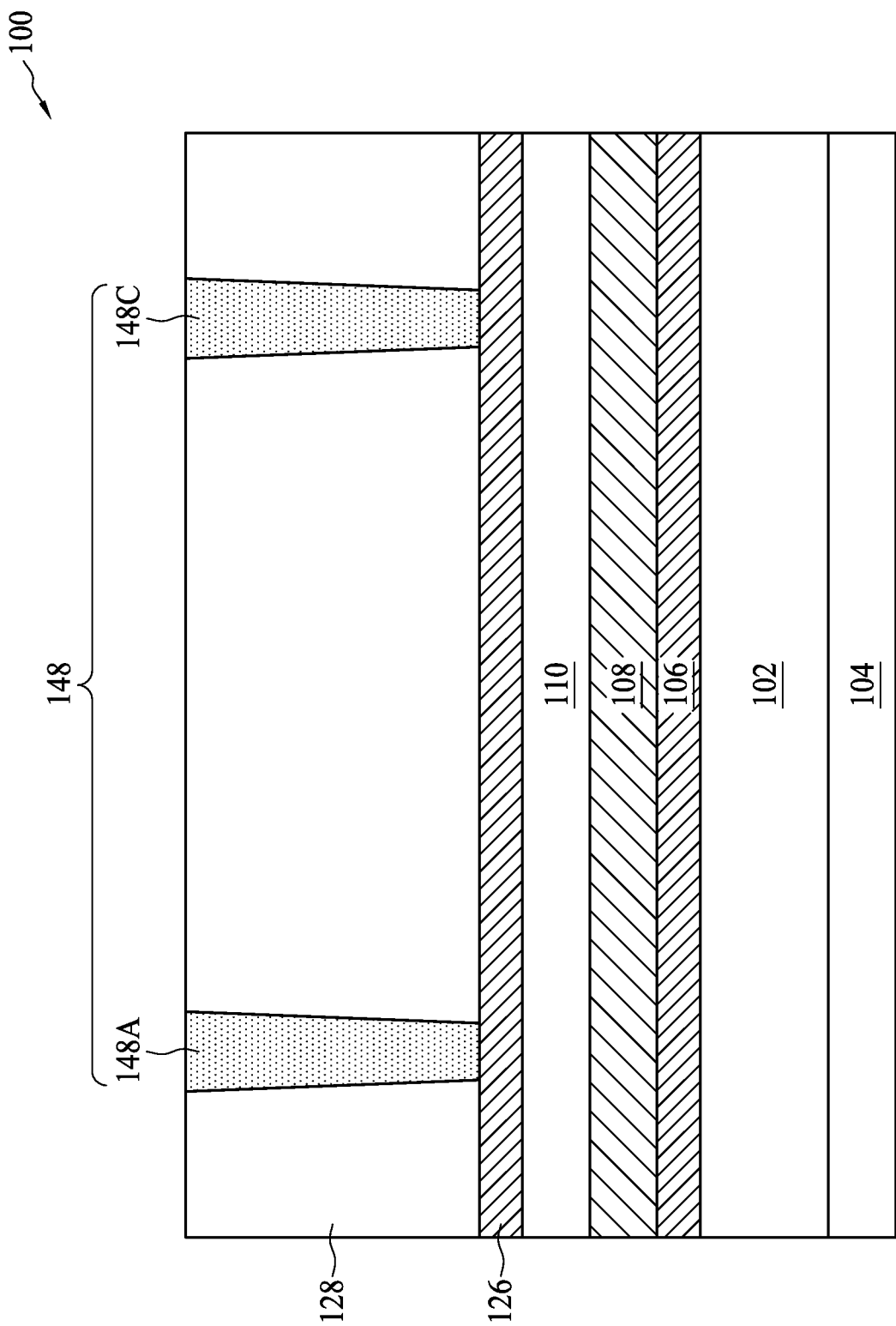

Next, in FIGS. 9A and 9B, a planarization operation (e.g., a chemical mechanical polish (CMP), grinding, dry etching, or combinations thereof) is performed to remove excess portions of the sacrificial material 138 over the middle layer 130. Line-end cut pattern 148 (including pillars 148A, 148B and 148C) are formed in the bottom layer 128 accordingly. In some embodiments, the middle layer 130 is also removed during the planarization operation. In some embodiments, a thickness of the bottom layer 128 is also removed during the planarization operation. After the planarization operation, the bottom layer 128 is exposed, and an upper surface of the line-end cut pattern 148 may be planar with an upper surface of the bottom layer 128.

Figure 10A:
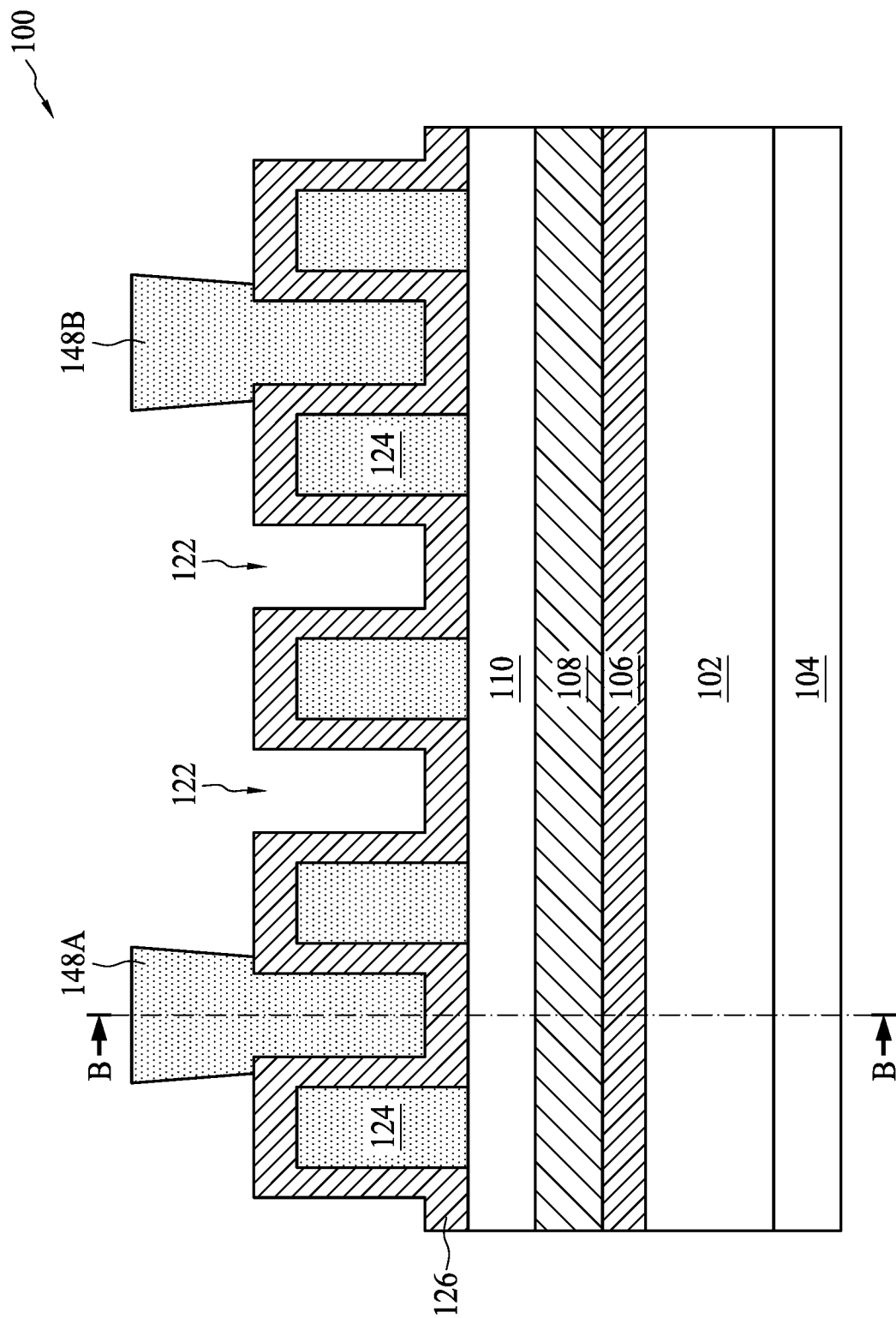
Figure 10B:
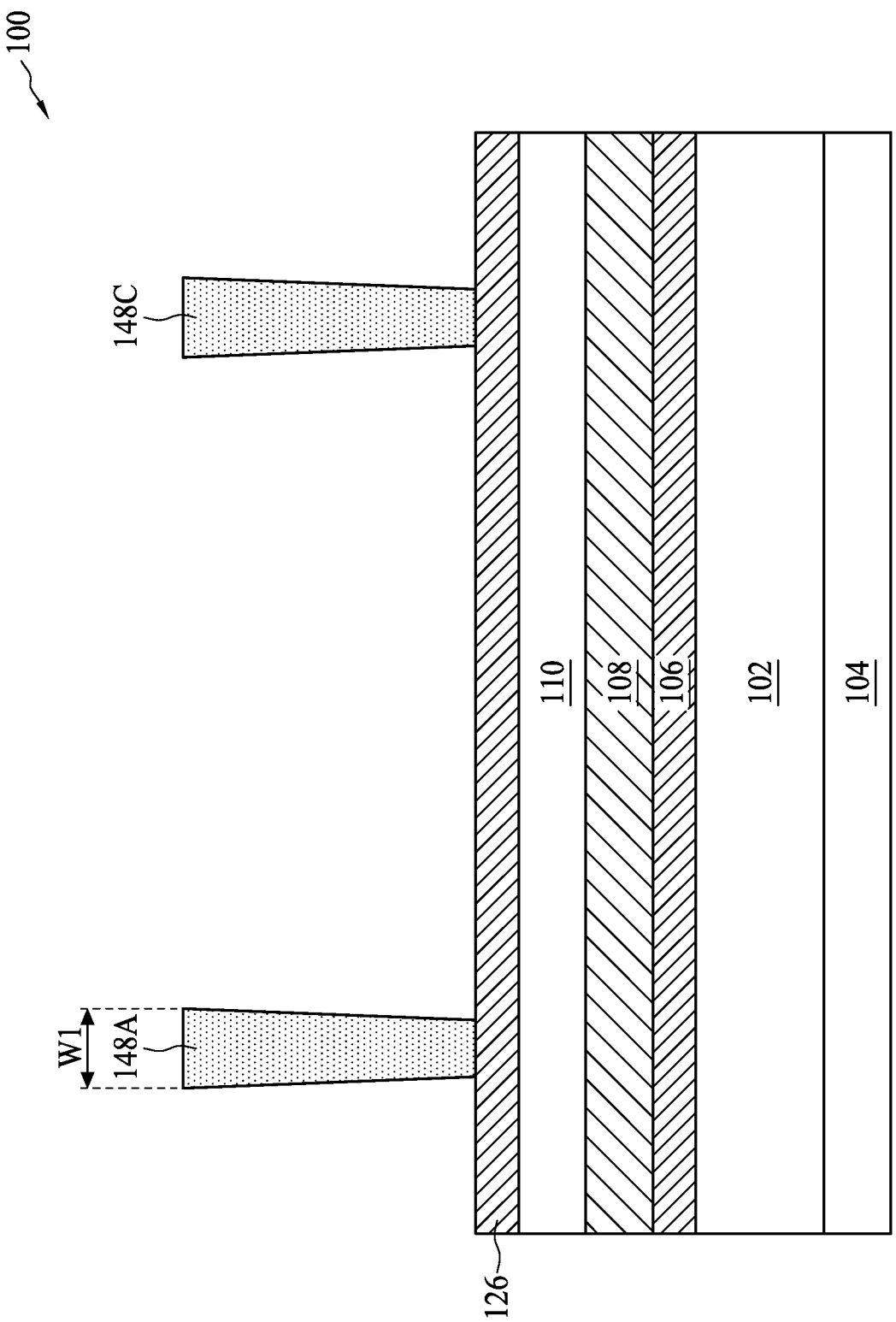

In FIGS. 10A and 10B, the bottom layer 128 is removed using an aching process. The openings 122 are exposed again through the removal of the bottom layer 128. In some portions of some openings 122, the pillars 148A, 148B and 148C of the line-end cut pattern 148 remain and fill portions of the openings 122. The pillars 148A, 148B and 148C also mask select portions of the spacer layer 126. In some embodiments, a pillar of the line-end cut pattern 148 spans from a first sidewall portion of the spacer layer 126 on a first mandrel 124 to an adjacent sidewall portion of the spacer layer 126 on a second mandrel 124 next to the first mandrel. In some embodiments, referring to FIG. 10B, the width W1 of pillar 148A or 148B of the line-end cut pattern 148 is about 40 nm.

Figure 11A:
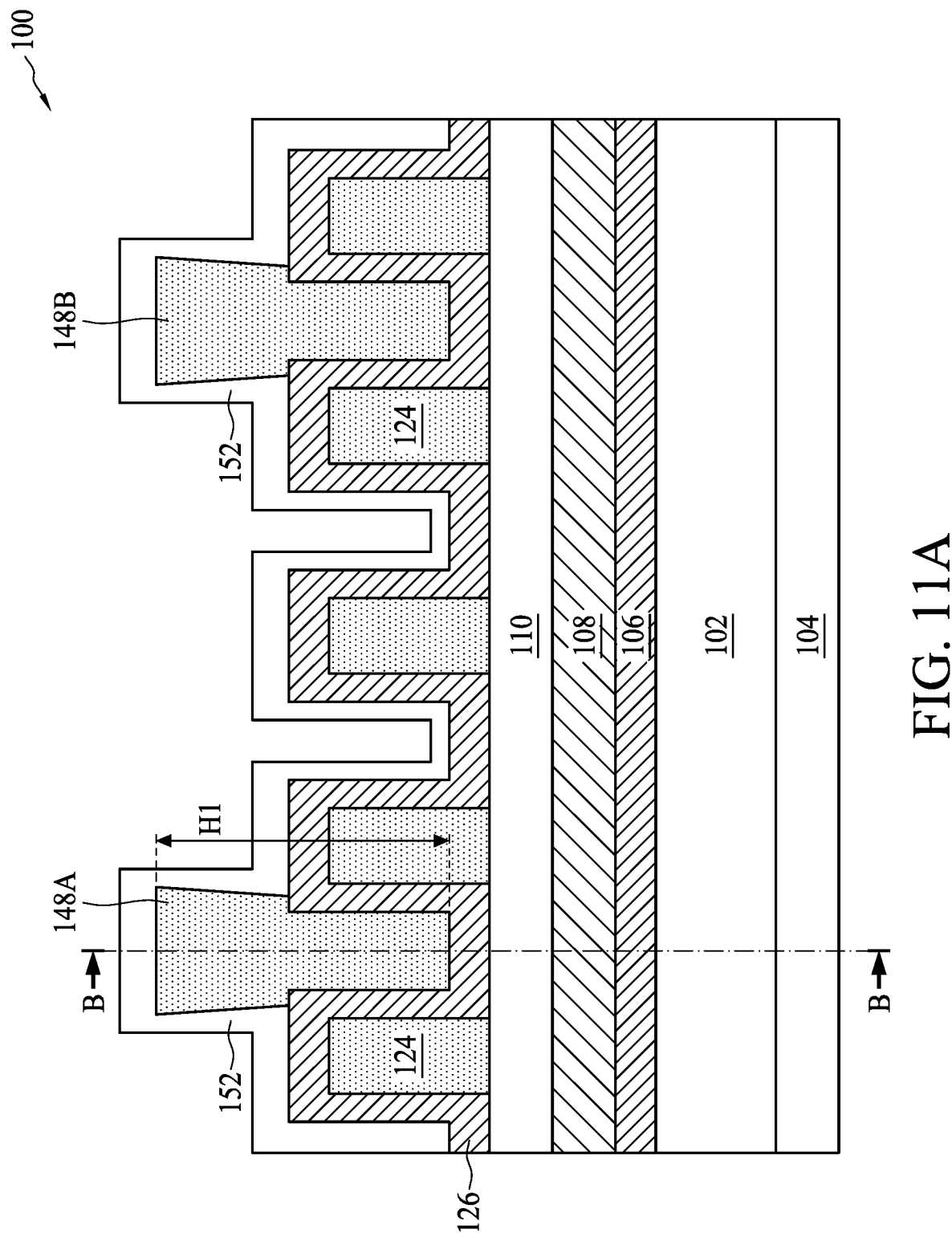
Figure 11B:
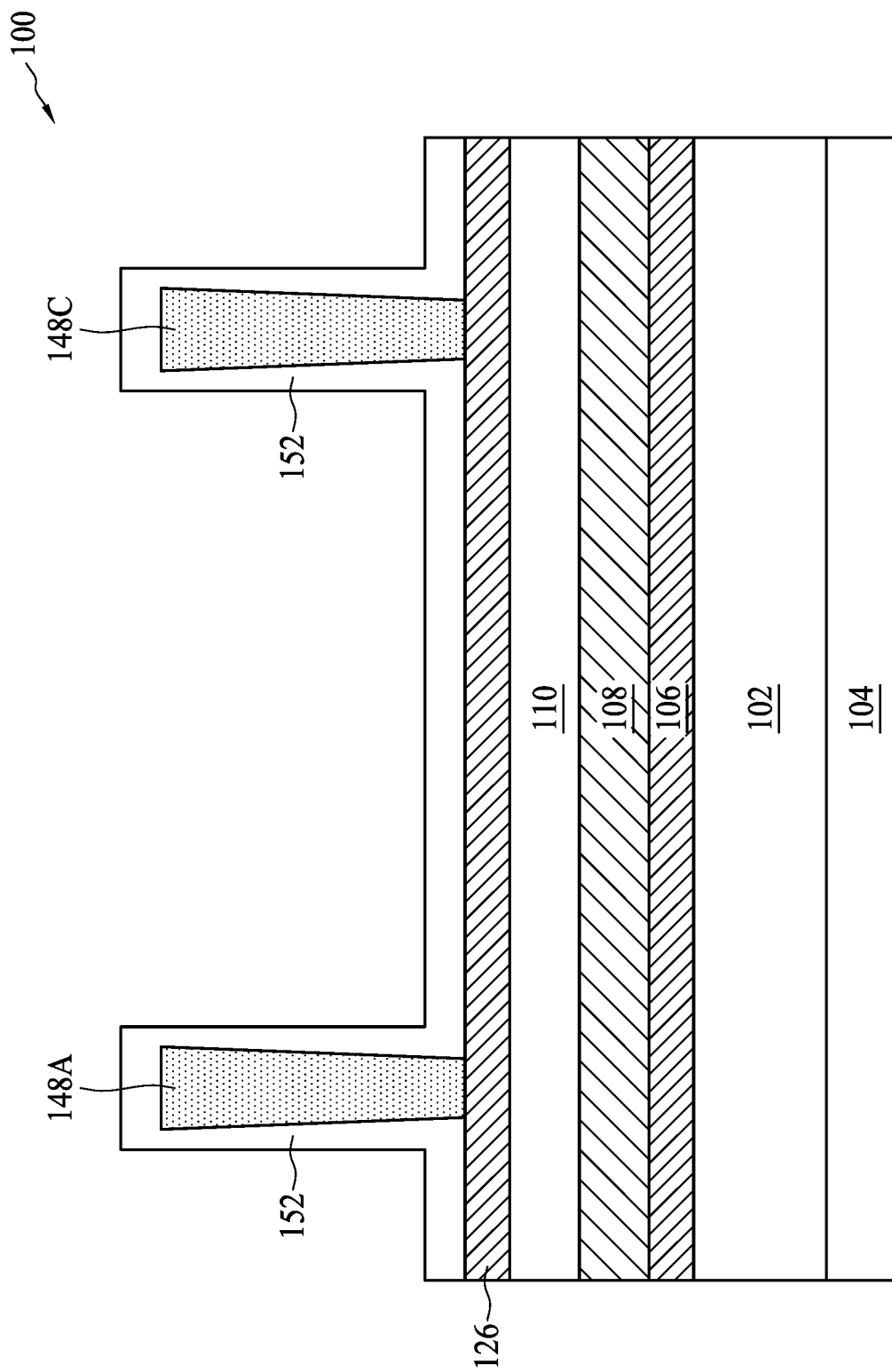

Subsequently, a protection layer 152 is deposited over the bottom layer 128 and the line-end cut pattern 148, as illustrated in FIGS. 11A and 11B. The protection layer 152 may be deposited on top surfaces and sidewalls of the line-end cut pattern 148. In some embodiments, the protection layer 152 covers the upper surface of the spacer layer 126. Referring to FIGS. 7A and 7B, the formed openings 136 may have a tapered sidewall from an upper surface to a bottom surface. Thus, each of the openings 136 may have a greater width at the top than at the bottom. Accordingly, the patterned line-end cut pattern 148 follows the width dimensions of the openings 136. In some embodiments, the deposited protection layer 152 serves to shape the pillar profile of the line-end cut pattern 148 in which the protection layer 152 has a greater thickness around the bottom portion of the pillars of the line-end cut pattern 148 than around the top surface of the line-end cut pattern 148. The non-uniform thickness deposition may be performed using a plasma-assisted deposition, such as PVD, CVD or other suitable operations. As such, the bottom portion of the pillars may be better protected under a subsequent etching operation. In some embodiments, the protection layer 152 has a thickness of less than about 30 nm. In some embodiments, the protection layer 152 has a thickness in a range between about 5 nm and about 30 nm.

In some embodiments, the protection layer 152 includes a dielectric material, such as a nitride (such as silicon nitride) or an oxide (such as silicon oxide). In some embodiments, the protection layer 152 includes a carbon-based material, such as SiCN, SiOCN, SiBCN, or polymer materials, such as epoxy, polyimide (PI), benzocyclobutene (BCB), polybenzoxazole (PBO). In some embodiments, the polymer material includes molecules of $CF_x$ species, in which the index x is a natural number. In some embodiments, the protection layer 152 is formed in a conformal manner using CVD, ALD or other suitable operations using appropriate reacting precursors such as $SiCH_4$-based gas, $NF_3$-based gas, $SiCl_4$-based gas, or $CH_4$-based gas. In some embodiments, the CVD operation of the protection layer 152 has a greater deposition rate in the vertical direction than in the horizontal direction. As a result, the protection layer 152 has greater thickness in areas above the top portion of the line-end cut pattern 148 and in areas above the spacer layer 126 than in areas on the sidewall of the line-end cut pattern 148. In an embodiment, a plasma-enhanced CVD (PECVD) operation is employed to form non-uniform sidewalls of the protection layer 152. The deposition of sidewalk using the plasma is performed along with etching of the sidewalls due to plasma bombardment. In an embodiment, the net deposition rate of the protection layer 152 at the top portion of the sidewalk is less than the net deposition rate of the sidewall at the bottom portion because the top portion receives more plasma bombardment than the bottom portion. Consequently, a non-uniform sidewall of the protection layer 152 is formed such that the bottom portion is thicker than the upper portion. In an embodiment, the protection layer 152 has a non-uniform sidewall thickness that tapers from the bottom portion to the top portion. As a result, since the pillars of the line-end cut pattern 148 have a greater width at the bottom than at the top, the modified line-end cut pattern 148 covered by the protection layer 152 has a more uniform width.

Figure 12A:
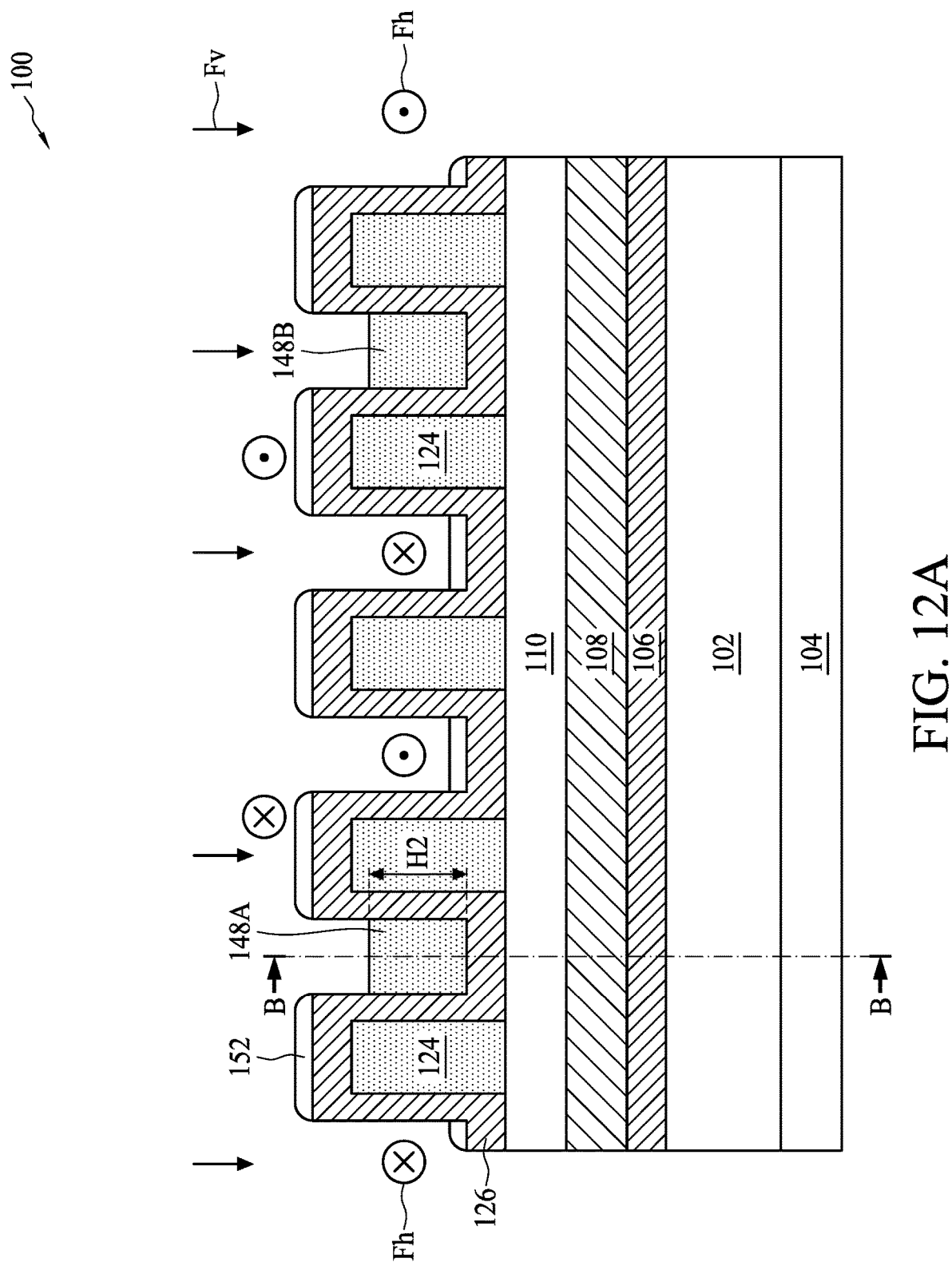
Figure 12B:
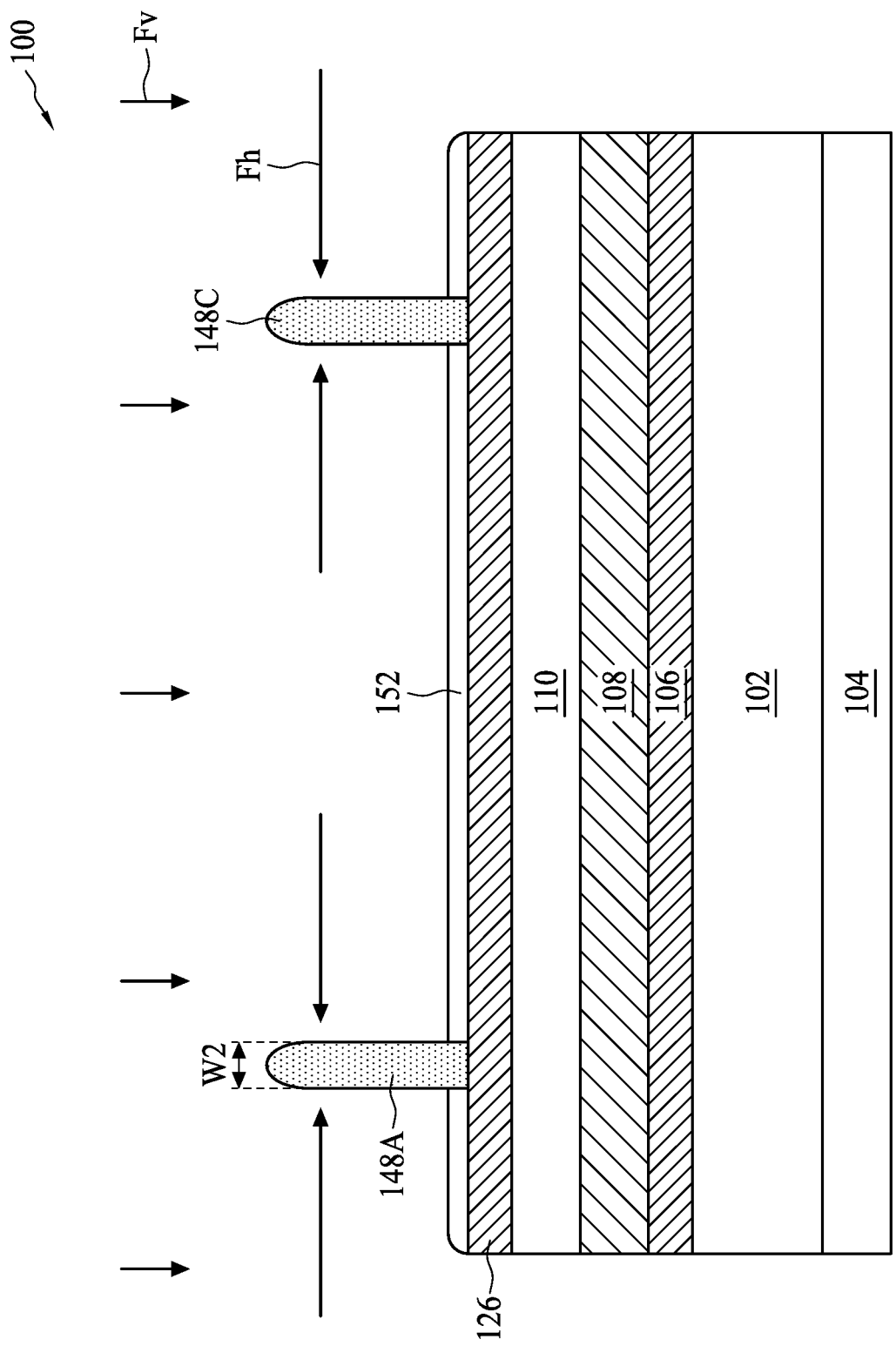

In FIGS. 12A and 12B, the line-end cut pattern 148 is trimmed in order to achieve a reduced width of below about 30 nm, for example 10 nm. As discussed previously, the pillar width W1 obtained using the existing photolithographic techniques and equipment may attain its limit of greater than about 40 nm and cannot be made any thinner (e.g., less than 30 nm). In the present disclosure, it is proposed to generate a reduced pillar width for the line-end cut pattern 148 by applying a trimming operation thereto. Furthermore, the protection layer 152 may serve as a sacrificial layer in trimming the pillars of the line-end cut pattern 148 such that the bottom portion of the pillars may be protected from breaking during trimming. As discussed previously, since the protection layer 152 helps shape the sidewall of the line-end cut pattern 148 such that the composite pillars of the line-end cut pattern 148/152 have a more uniform width, the line-end cut pattern 148 can be protected from breaking around the bottom portion during the etching operation. In some embodiments, the spacer layer 126 is inevitably impacted during the trimming of the line-end cut pattern 148. Under that situation, the protection layer 152 over the spacer layer 126 may serve another function of protecting the spacer layer 126 from being etched. In some embodiments, the protection layer 152 on the upper surface and sidewall of the pillars of the line-end cut pattern 148 is completely removed during trimming of the line-end cut pattern 148. In some embodiments, an etchant is used in which the etching selectivity between the protection layer 152 and the spacer layer 126 is greater than about 3. In some embodiments, an etchant is used in which the etching selectivity between the protection layer 152 and the spacer layer 126 is between about 3 and about 1.0. In some embodiments, the sacrificial material 138 has an etching selectivity similar to that of the protection layer 152 with respect to the spacer layer 126 under a same etchant. In some embodiments, an etchant is used in which the etching selectivity between the sacrificial material 138 and the spacer layer 126 is between about 3 and about 10. In an embodiment in which the spacer layer 126 is formed of TiO, a fluorine-based etching gas, such as $CF_4$, $CH_2F_2$ or $CH_3F$, provides a sufficient etching selectivity (e.g., greater than about 5) in trimming the protection layer 152 and the line-end cut pattern 148 while keeping the spacer layer 126 intact.

In some embodiments, the trimming operation removes a height of the pillars of the line-end cut pattern 148 below a topmost surface of the spacer layer 126 (see FIG. 12A). In some embodiments, the trimmed line-end cut pattern 148 has a top surface below a top surface of the mandrels 124. The line-end cut pattern 148 has a reduced height H2. In some embodiments, a sidewall portion of the spacer layer 126 over the reduced line-end cut pattern 148 is exposed by the trimming operation. In some embodiments, the trimming operation removes a width of the pillars of the line-end cut pattern 148 below a topmost surface of the spacer layer 126 (see FIG. 12B). In some embodiments, each pillar of the trimmed line-end cut pattern 148 has a tapered sidewall. The pillars of the line-end cut pattern 148 have a reduced width W2. In some embodiments, horizontal portions of the spacer layer 126 are still covered by the protection layer 152 through the trimming operation.

Figure 13A:
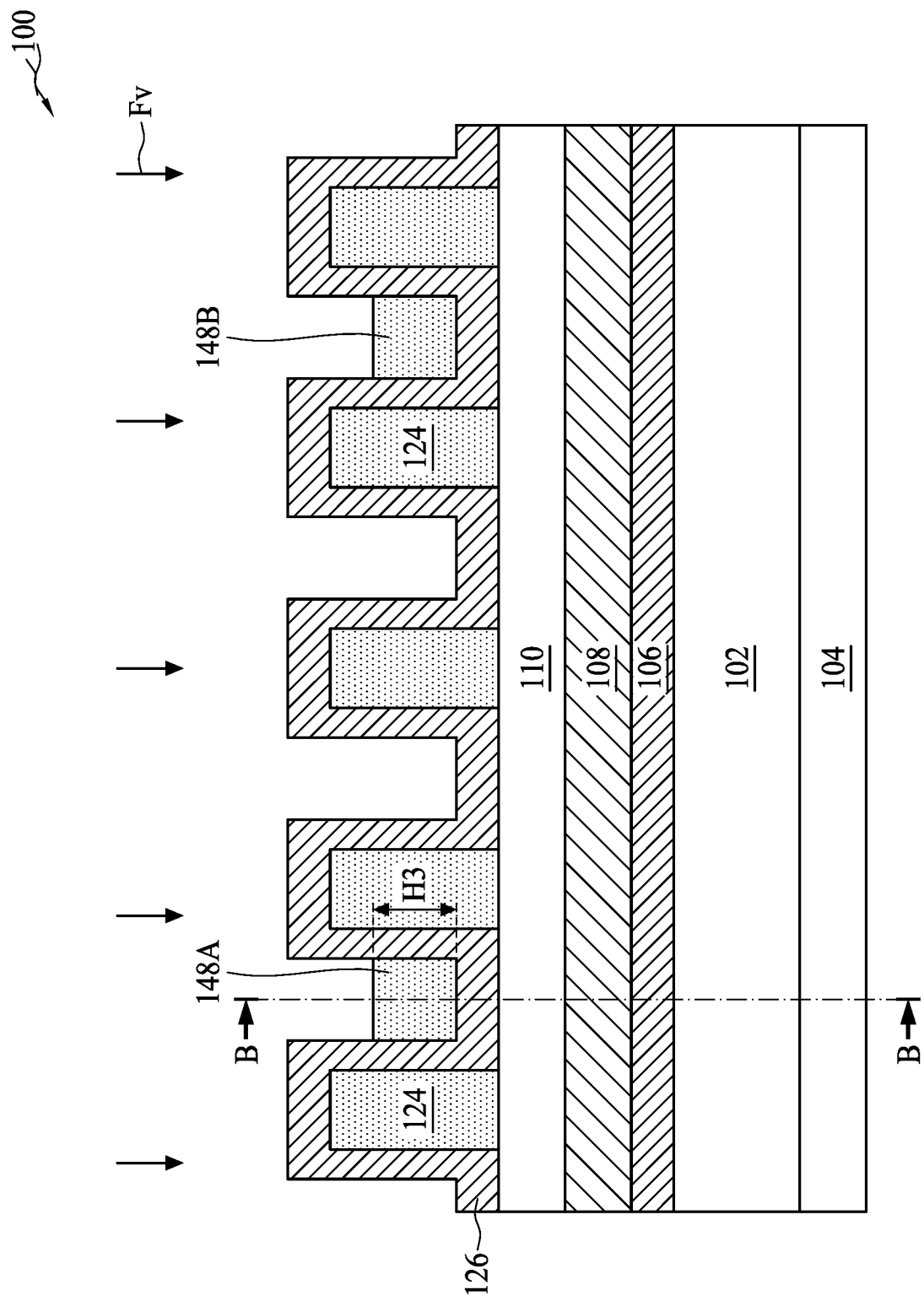
Figure 13B:
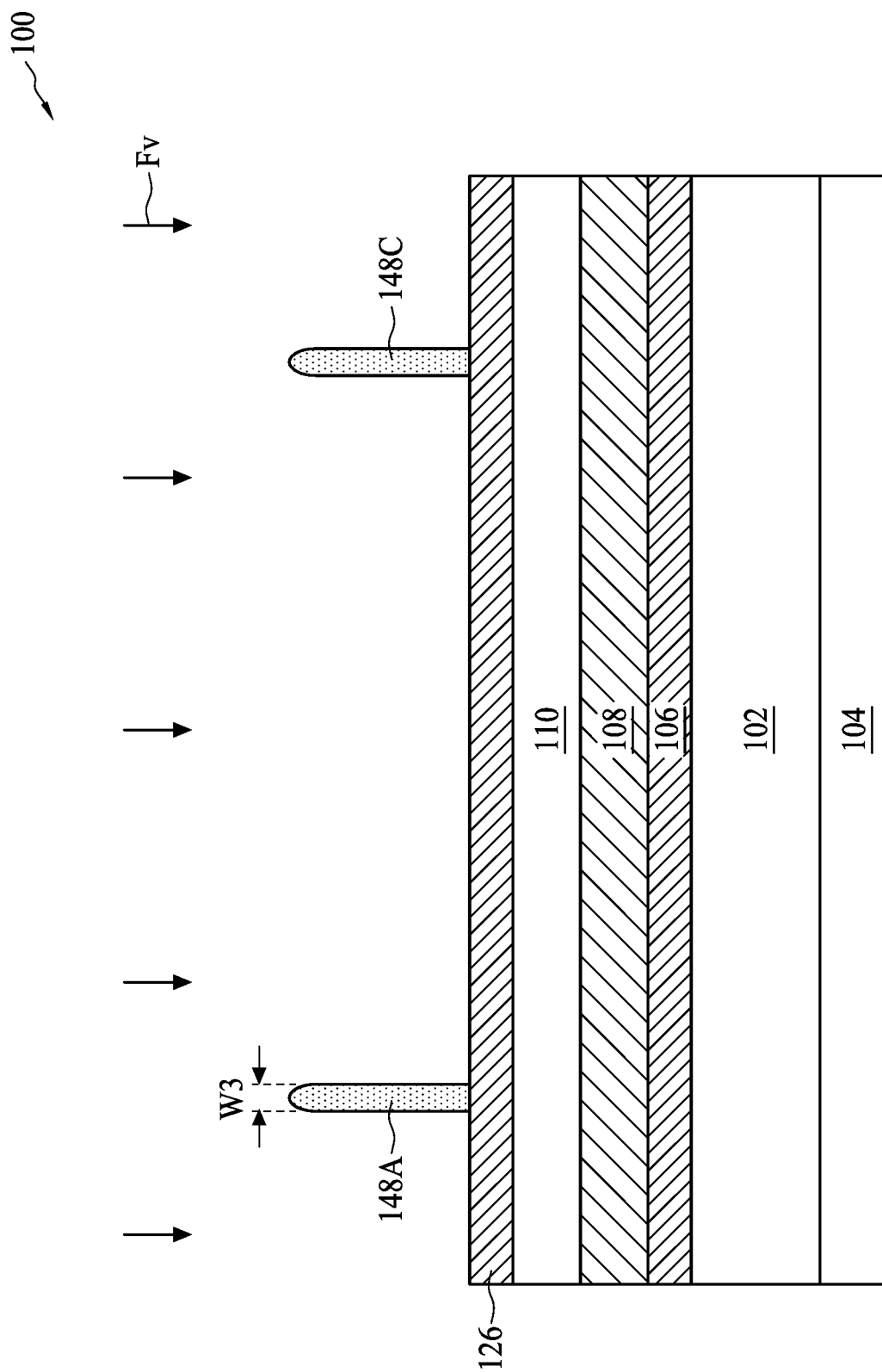

In FIGS. 13A and 13B, residuals of the protection layer 152 on horizontal portions over the spacer layer 126 are removed using an etching operation after the trimming operation of the line-end cut pattern 148 in case the protection layer 152 is not completely removed along with the trimming of the line-end cut pattern 148. The horizontal portions of the spacer layer 126 are exposed accordingly. In some embodiments, the etching operation includes a dry etch, a wet etch or a combination thereof. In some embodiments, the complete removal of the protection layer 152 is performed in a same operation as the etching of the line-end cut pattern 148 in which different etching factors (e.g., the plasma bombardment angles, the duty cycle of a pulsed plasma source and the duty cycle of a pulsed RF source) are utilized throughout the operation.

Referring to FIG. 13A, the line-end cut pattern 148 has a reduced height H3 less than the height H2, in some embodiments, the finalized line-end cut pattern 148 is reduced more than about 10% of its original height H1 In some embodiments, the line-end cut pattern 148 is reduced by about 10% to about 30% of its original height H1. In some embodiments, the resultant line-end cut pattern 148 has a reduced height H3 less than about 100 nm. In some embodiments, the height H3 is between about 30 nm and about 100 nm. In some embodiments, the height H3 is between about 30 nm and about 50 nm.

In some embodiments, the trimming operation successively removes the width of each pillar of the line-end cut pattern 148, for example, from an original width W1 (FIG. 10B) to a reduced width W2. (FIG. 12B) and then to a final width W3 (FIG. 13B). In some embodiments, the width W2 is substantially equal to the width W3 such that the trimming operation in FIG. 13B primarily focuses on the removal the protection layer 152 on the spacer layer 126. In some embodiments, the final width W3 of each pillar of the line-end cut pattern 148 is reduced from its original width W1 by about 10% to about 30%. In some embodiments, the final width W3 of each pillar of the line-end cut pattern 148 is reduced from its original width W1 by more than about 30%. In some embodiments, the final width W3 of each pillar of the line-end cut pattern 148 is reduced from its original width W1 by about 30% to about 50%. In some embodiments, the resultant width W3 of the line-end cut pattern 148 is less than about 30 nm. In some embodiments, the width W3 is less than about 10 nm. In some embodiments, the width W3 is between about 10 nm and about 30 nm. In some embodiments, the width W3 is between about 15 nm and about 30 nm.

Referring back to FIGS. 12A and 12B, in the present embodiment, the trimming operation of the protection layer 152 as well as the line-end cut pattern 148 may include a dry etch. In embodiments in which a dry etch is used, a fluorine-based etchant (e.g., $CF_4$) is used. In some embodiments, other etchants are used, such as oxygen ($O_2$), nitrogen ($N_2$), argon (Ar), or the like, in a mixed etchant recipe. An isotropic etching may be achieved through the etch operation, for example, using a plasma-assisted etching. The isotropic etching is performed using a high-pressure and low-biasing plasma source to increase the amount of neutral particles or radicals in the plasma rather than the amount of ionic particles. The increased neutral particles help provide lateral etching on the sidewalls of the line-end cut pattern 148. Under such conditions, the etching rates in the vertical direction and the horizontal direction may be similar. In some embodiments, the pressure of the etching operation is, for example, in a range between about 40 and about 60 millitorr, and the biasing voltage is less than about 40 volts.

In some embodiments, an etching ratio between a lateral direction (i.e., the direction facing the sidewalls of the pillar 148A) and a vertical direction (i.e., the direction facing the planar surface of the spacer layer 126) is greater than about 2. In some embodiments, the etching operation can be done in an anisotropic manner. In an embodiment, the etching recipe is adjusted to provide a greater etch rate on sidewalls of the pillar 148 than on the top portion thereof. In an embodiment, by controlling the compositions of the reacting gas, a thin film (such as polymer) is formed simultaneously as a by-product during the etching process. The film covers the upper surface of the etched pillars 148 and prevents the plasma from further etching the pillars 148 from above, causing a lower etch rate in the vertical direction. In some embodiments, a pulsed RF source may be used in which a lowered duty cycle of the RF source decreases the etch rate in the vertical direction. In some embodiments, a pulsed plasma source may be used in which a lower amount of ionic particles decreases the etch rate in the vertical direction. Referring to FIGS. 12A and 12B, the circles and arrows Fh indicate the direction of the horizontal etching, in which the circle Fh encircling a dot means a horizontal direction pointing to the paper and the circle Fh encircling a cross means a horizontal direction pointing to the reader. Further, the arrows Fv shown in FIGS. 12A, 12B, 13A and 13B indicate the direction of the vertical etching.

In some embodiments, an anisotropic etching operation is used based on the recipe of the isotropic etching discussed above. The concentration of the provided diluted fluorine-based gas is further reduced, making the gas concentration differences in different locations of the process chamber more pronounced. The differences in gas concentration lead to an etching rate for the protection layer 152 on the sidewalk and upper portion of the pillars of the line-end cut pattern 148 greater than the etching rate of the protection layer 152 on the spacer layer 126. As a result, portions of the protection layer 152 remain on upper surfaces of horizontal portions of the spacer layer 126. The etching operation may be performed to etch sidewalk of the protection layer 152 at a first etch rate greater than a second etch rate on horizontal portions of the protection layer 152. In an embodiment, the etching operation provides an etching ratio between a lateral direction and a vertical direction in a range between about 1 and about 2. The greater etching capability in the lateral direction than in the vertical direction aids in width reduction of the pillar 148A and protection of the spacer layer 126.

Figure 14A:
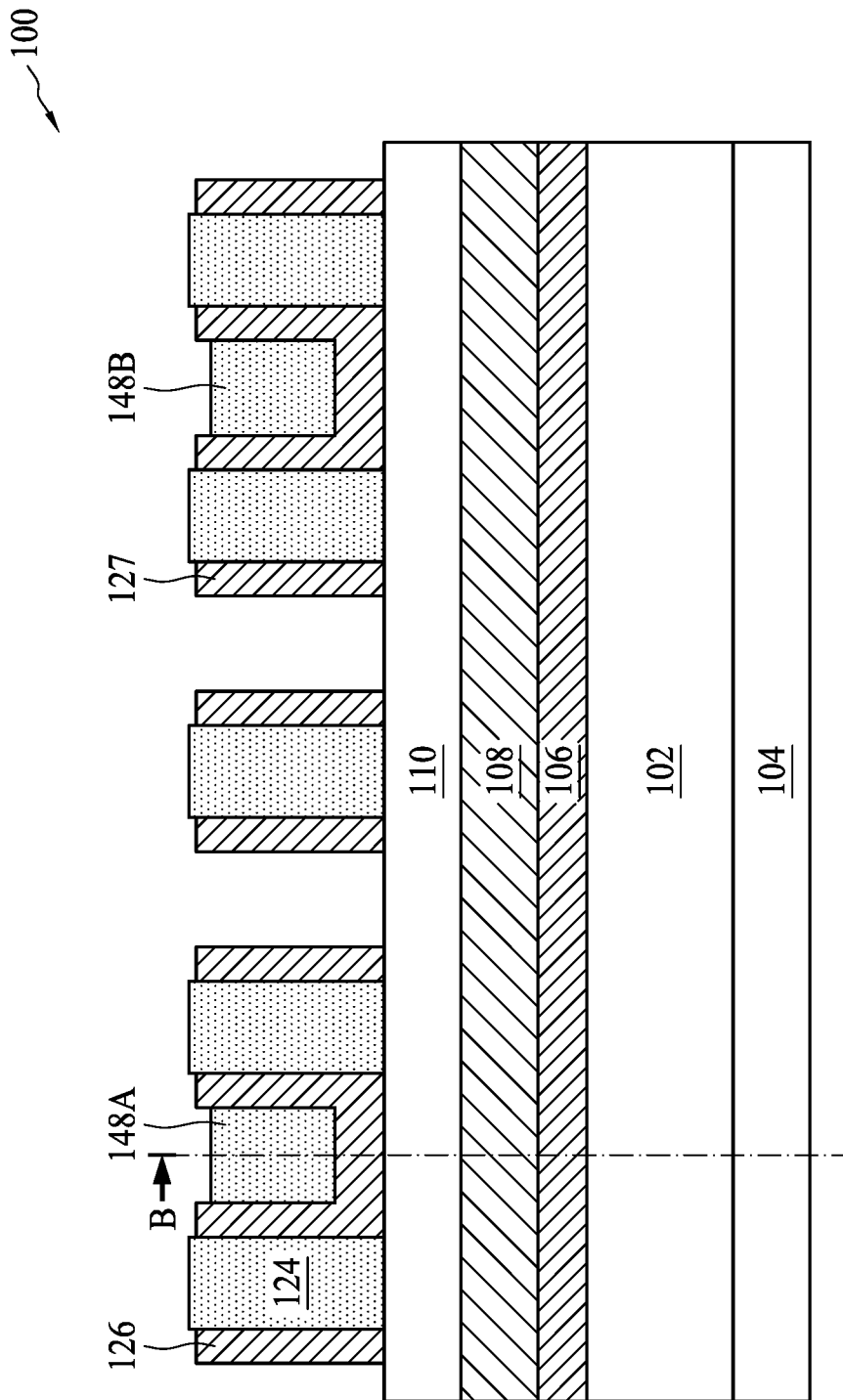
Figure 14B:
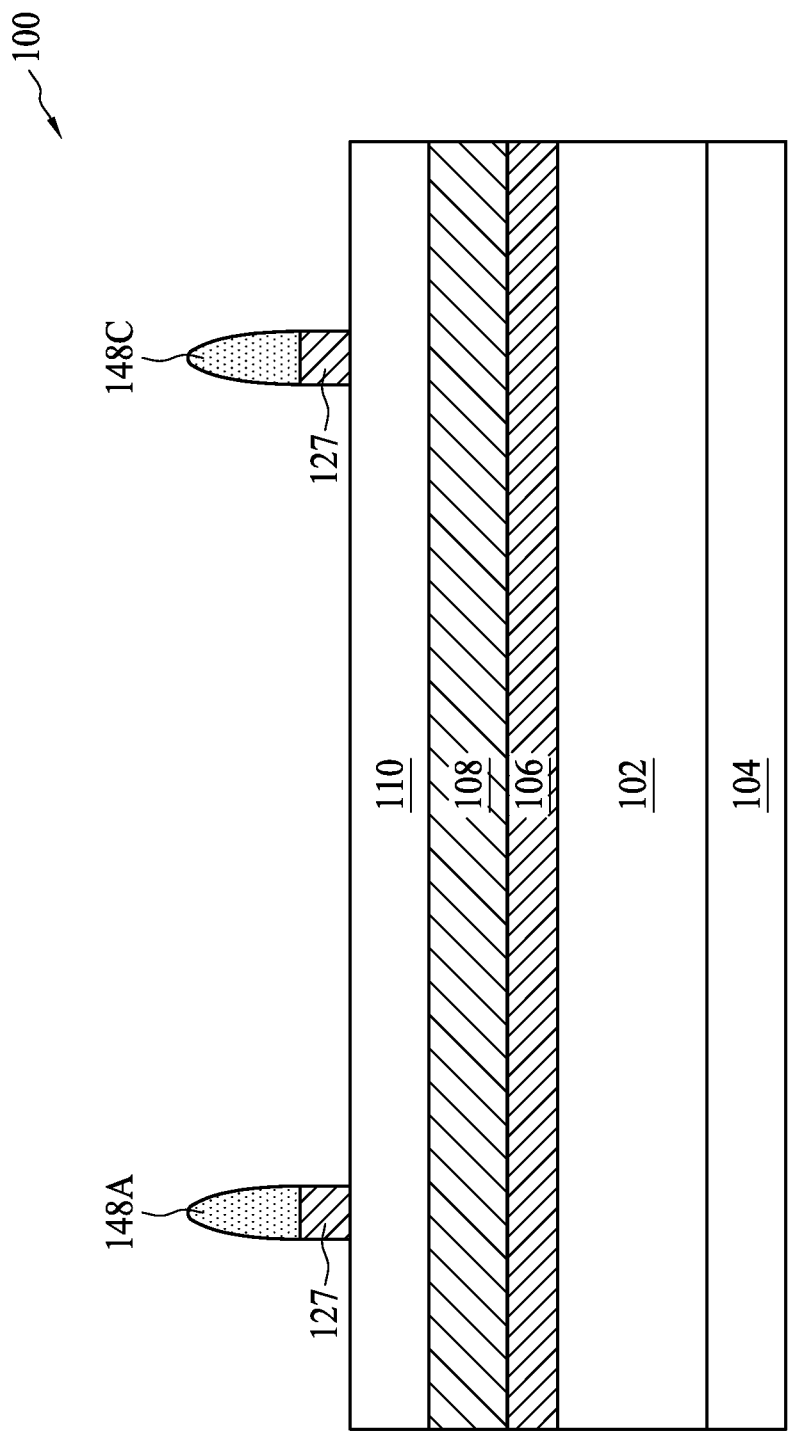

Subsequently, referring to FIGS. 14A and 14B, an etching operation is performed to remove some horizontal portions of the spacer layer 126. A thinned vertical portion of the spacer layer 126 (labeled as a spacer layer 127) may remain after the etching operation. In some embodiments, some horizontal portions of the spacer layer 126 masked by the line-end cut pattern 148 remain after the etching operation. A portion of the dielectric layer 110 is exposed after the etching operation. In some embodiments, the etching operation is performed using a dry etch with an etchant, such as $CH_4$, $Cl_2$, combinations thereof, and the like. Other gases, e.g., nitrogen ($N_2$) may be used in combination with the etchant during the dry etch operation. The dry etch operation may include anisotropic etching without significantly removing vertical portions of the spacer layer 127 or the line-end cut pattern 148.

Figure 15A:
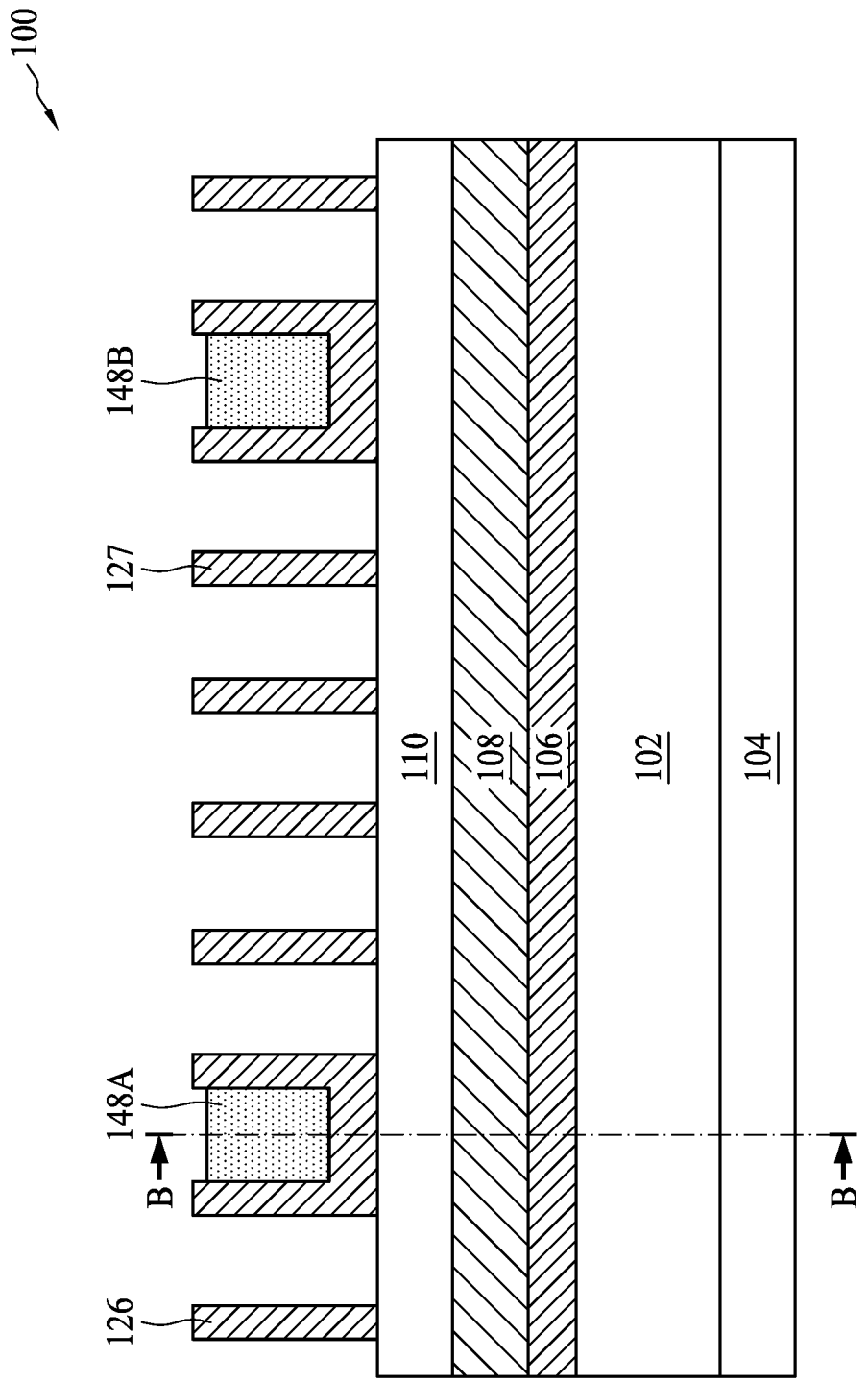
Figure 15B:
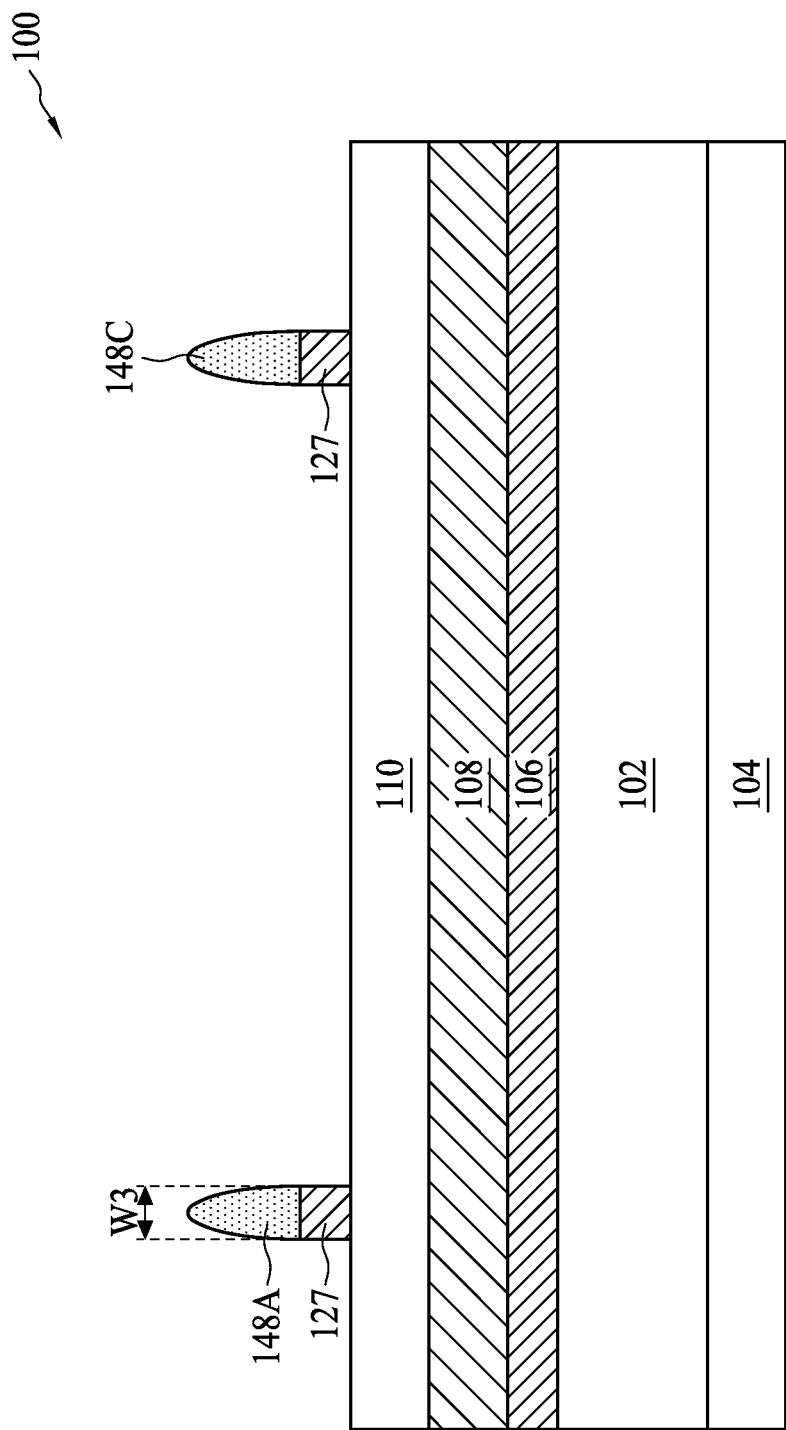

In FIGS. 15A and 15B, the mandrels 124 are removed using an etching operation. Because the mandrels 124 are differentiated from the spacer layer 126 and the line-end cut pattern 148 in terms of etching selectivity with respect to a same etching operation, the mandrels 124 are removed without significantly removing the etched spacer layer 127 or the line-end cut pattern 148. The underlying dielectric layer 110 acts as an etch stop layer during the etch of the mandrels 124.

Figure 16:
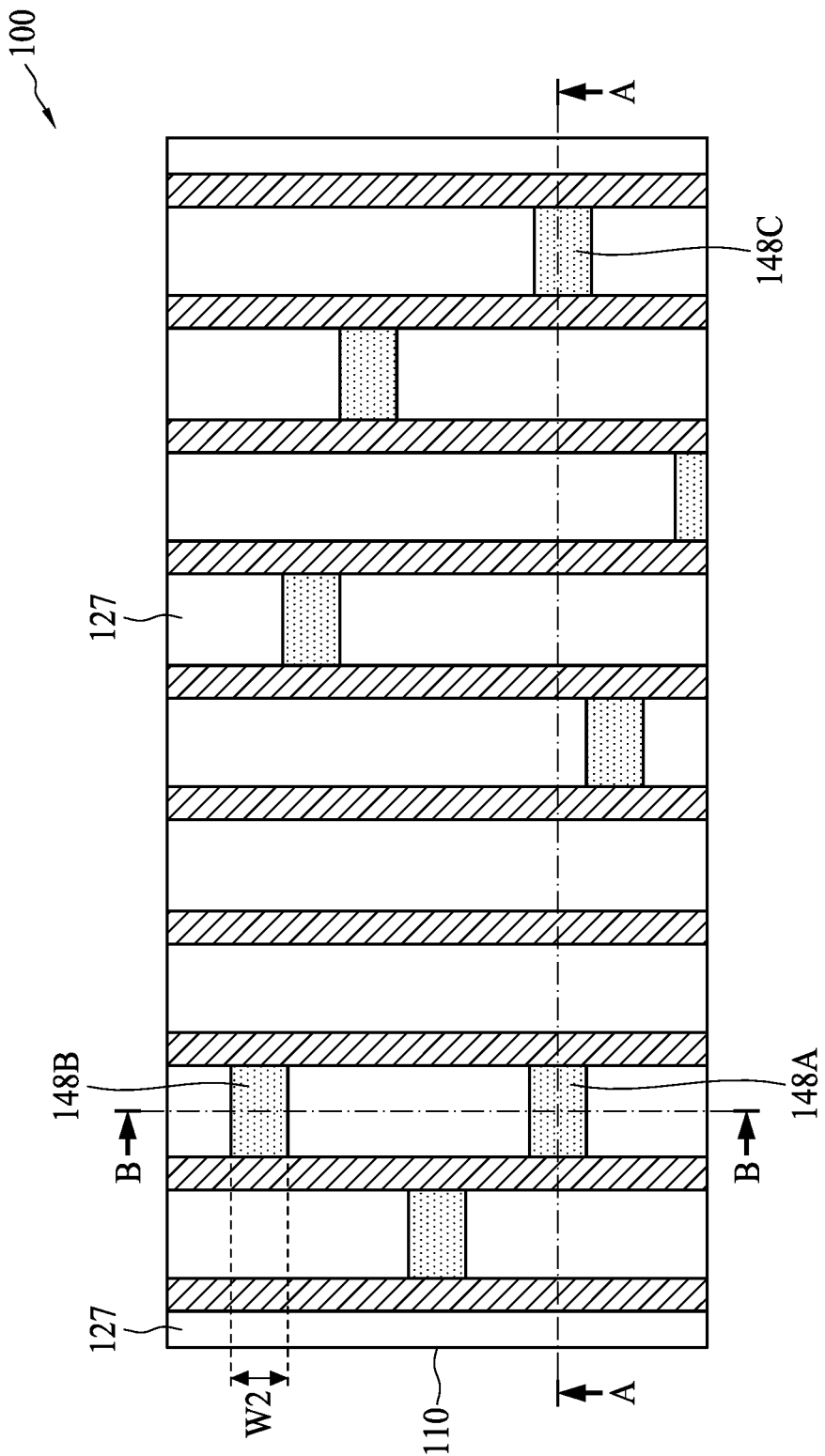

After the mandrels 124 are removed, the line-end cut pattern 148 has the width W3. In embodiments where an SADP process as described above is employed, the width W3 is below the critical dimension achievable by photolithographic processes alone. The combination of the spacer layer 127 and the line-end cut pattern 148 defines a pattern of conductive lines for the mask layer 108. FIG. 16 illustrates a plan view of a pattern defined by the spacer layer 127 and the line-end cut pattern 148. FIG. 15A illustrates a cross-sectional view taken along sectional line AA of FIG. 16 while FIG. 15B illustrates a cross-sectional view taken along sectional line BB of FIG. 16. In some embodiments, the space other than the area defined by the spacer layer 127 and the line-end cut pattern 148 corresponds to a pattern of subsequently formed conductive lines. As illustrated by FIG. 16, the line-end cut pattern 148, which includes the pillars 148A, 148B and 148C, cuts between adjacent segments of the line patterns in the spacer layer 127. When conductive lines are subsequently formed, a desirable line spacing W3 of conductive line segments is obtained.

Figure 17A:
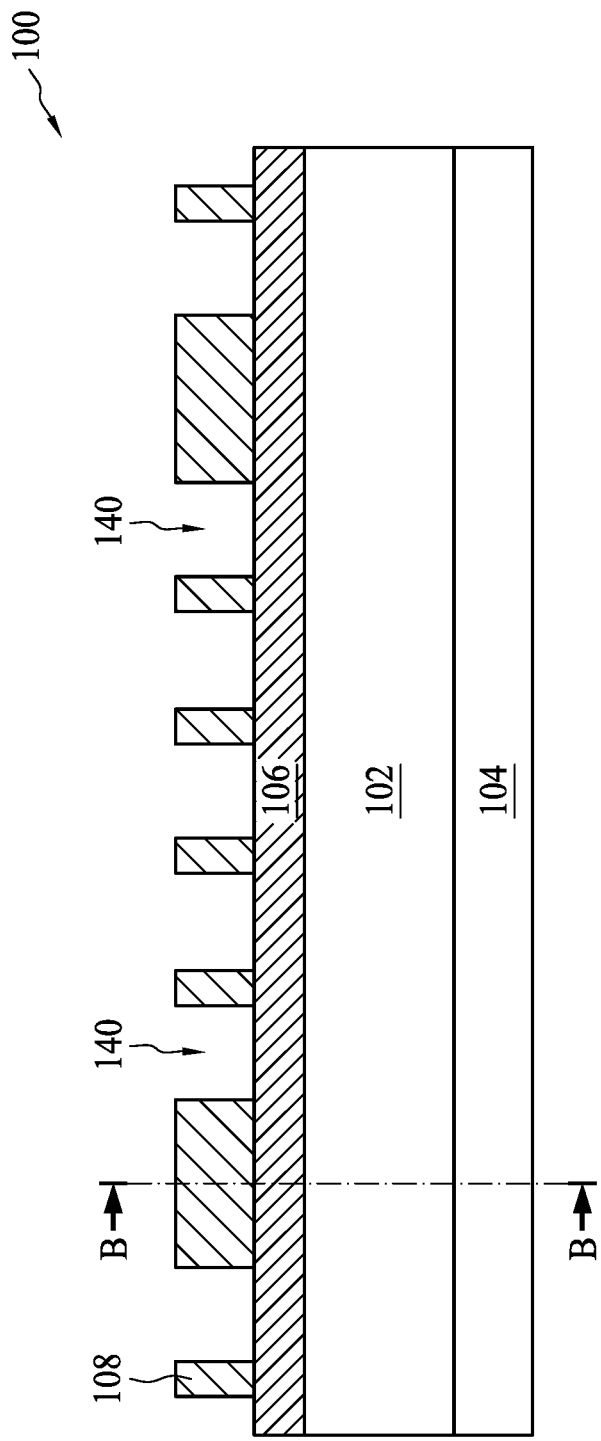
Figure 17B:
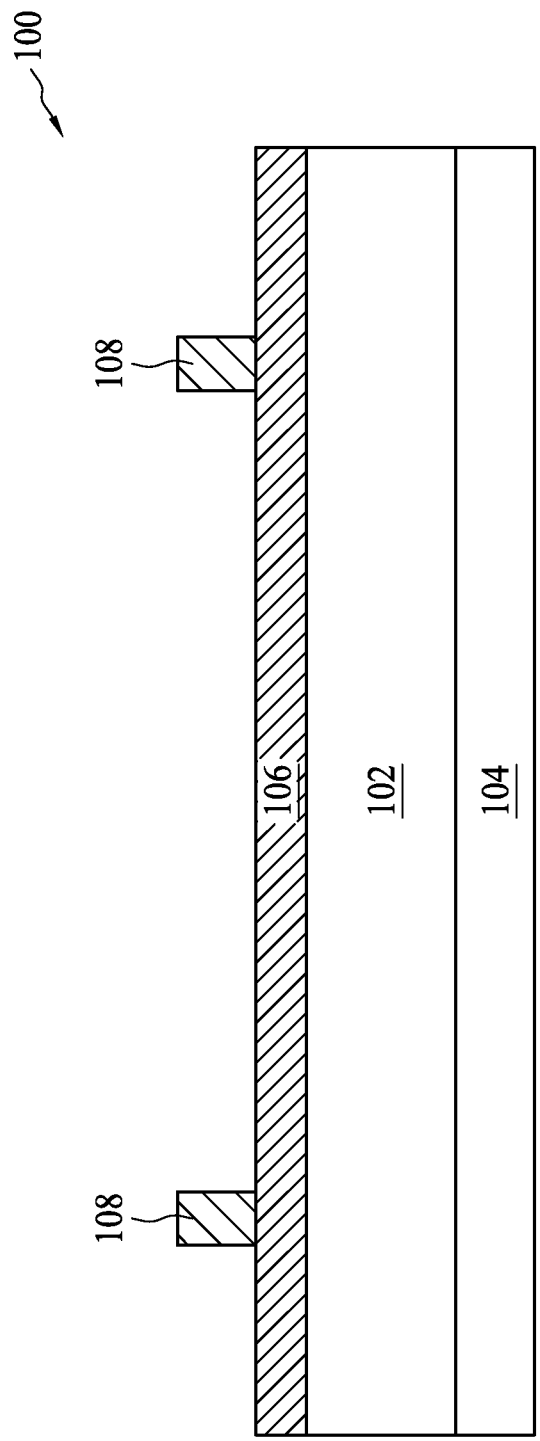

FIGS. 17A, 17B, 18A, 18B, 19A, 19B, and 20 illustrate cross-sectional views of a method of processing the target layer 102 following the operation in FIGS. 15A and 15B. In the embodiments, the target layer 102 is a dielectric layer and patterned conductive features are formed in such dielectric layer. Referring first to FIGS. 17A and 17B, the dielectric layer 110 and the mask layer 108 are sequentially etched using the spacer layer 127 and the line-end cut pattern 148 as an etching mask. Accordingly, the mask layer 108 receives a pattern that is the same as that composed of the spacer layer 127 and the line-end cut pattern 148 from a plan view. In some embodiments, the etching operation comprises an anisotropic dry etch or a wet etch operation. After the mask layer 108 is patterned, a wet cleaning may be performed to remove any remaining portions of the spacer layer 127, the line-end cut pattern 148, and the dielectric layer 110.

Figure 18A:
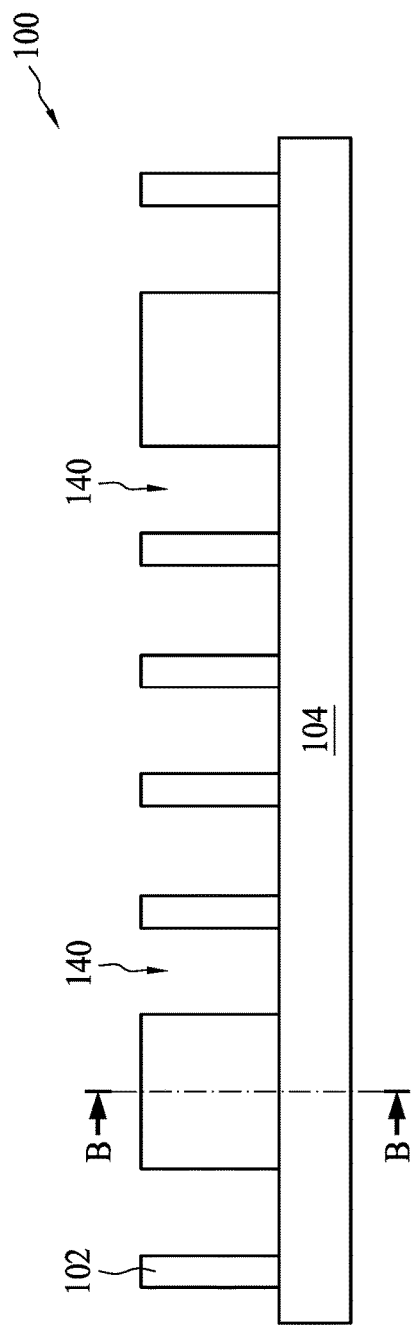
Figure 18B:
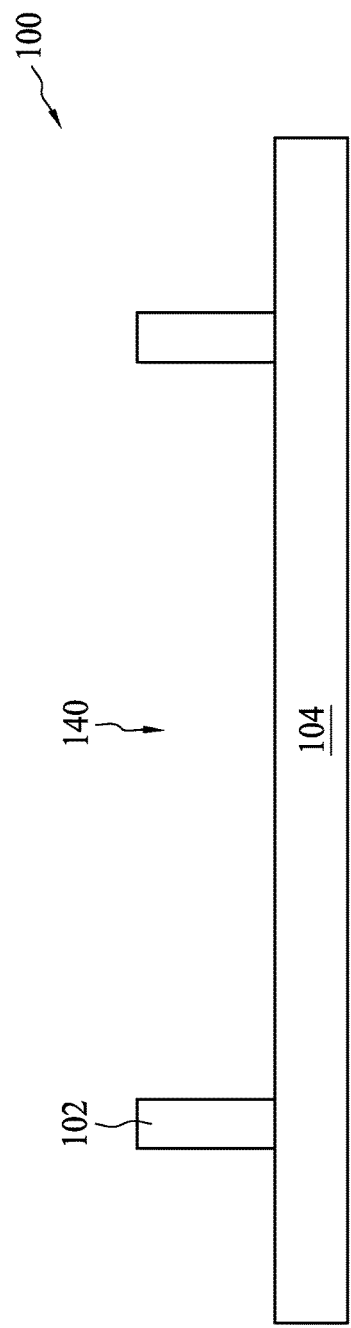

Subsequently, in FIGS. 18A and 18B, the mask layer 108 is used as an etching mask to pattern openings 140 in the target layer 102. An etching operation is used which sequentially etches through the ARC 106 and the target layer 102. Remaining portions of the target layer 102 may have a same pattern as that formed of the spacers 127 and the line-end cut pattern 148 of FIG. 16. The etching operation for patterning the target layer 102 may include a dry etch, a wet etch, or a combination thereof. After the openings 140 are patterned, a wet cleaning operation may be performed to remove remaining portions of the mask layer 108 and the ARC 106.

After openings 140 are patterned in the target layer 102, conductive features are formed in the openings 140 of the target layer 102. In some embodiments, the target layer 102 is formed of low-k dielectric materials, and the patterned target layer 102 provides an for forming an interconnect structure. Conductive lines or conductive vias 146 are formed in the target layer 102 as illustrated by FIGS. 19A and 19B. The conductive lines include conductive materials 144 formed of, for example, copper, tungsten, titanium, or the like. In some embodiments, the conductive lines 146 include one or more layers, such as liners 142 along sidewalls and a bottom surface of the openings 140. The liners 142 comprise TiO, TiN, TaO, TaN, or the like and provide diffusion barrier, adhesion, and/or seed layers for the conductive materials 144. The liners 142 and the conductive materials 144 are deposited using any suitable process, such as PVD, CVD, ALD, and the like.

Figure 20:
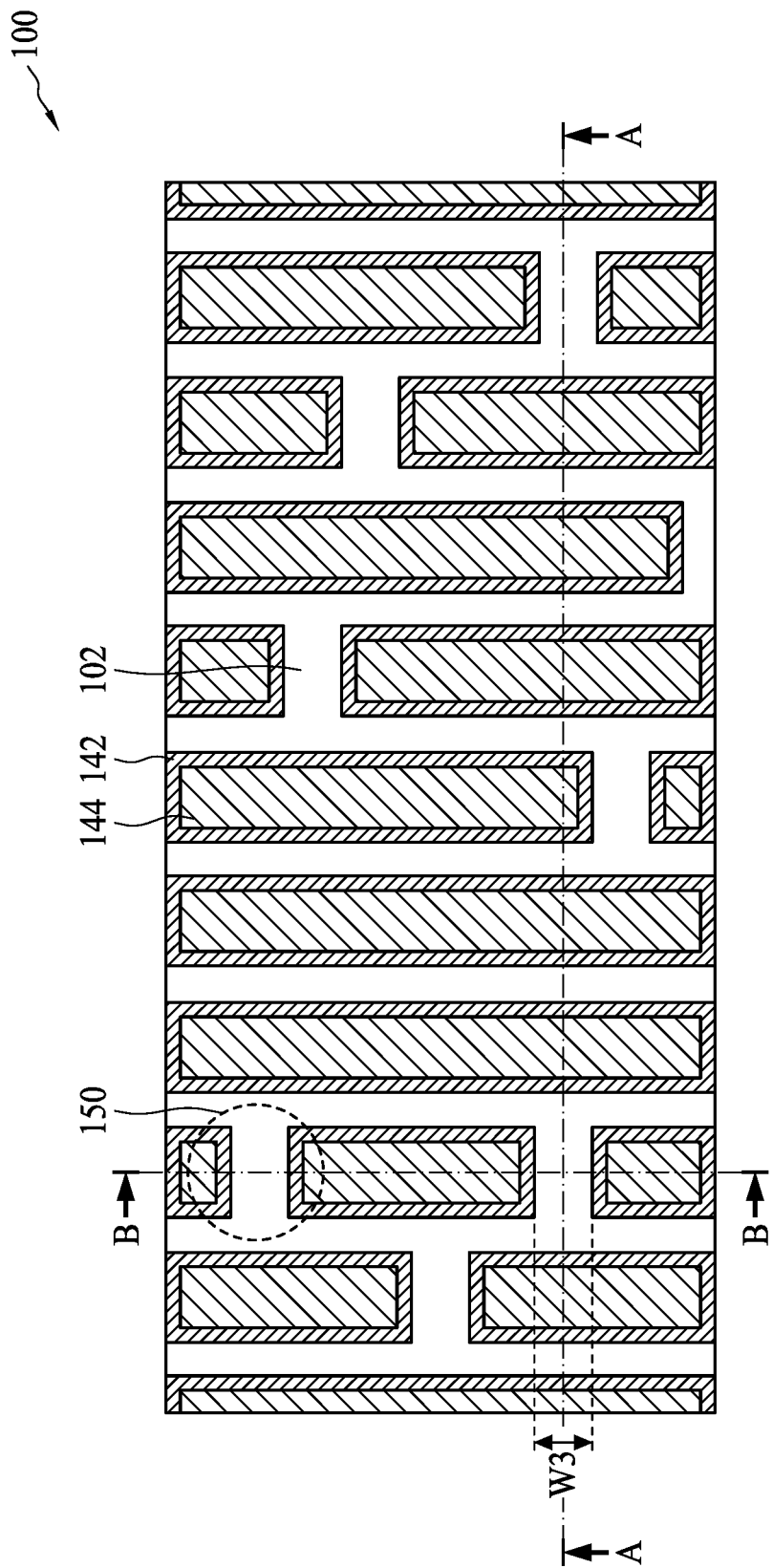

In some embodiments, a planarization process is performed to remove excess portions of the conductive materials 144 over the target layer 102. Thus, conductive features are formed in the target layer 102. FIG. 20 illustrates a top view of the conductive lines 146. FIG. 19A illustrates a cross-sectional view taken along sectional line AA of FIG. 20 while FIG. 19B illustrates a cross-sectional view taken along sectional line BB of FIG. 20. An exemplary line-end cut portion 150 in FIG. 20 corresponds to a pattern of the line-end cut pattern 148 pattern in FIG. 16. As illustrated by FIG. 20, the line-end cut portion 150 cuts a conductive line into adjacent line segments. The line spacing defined by the line-end cut pattern 150 of about 30 nm or below is thus maintained.

According to an embodiment of the present disclosure, a method of manufacturing semiconductor device includes: forming a first mandrel and a second mandrel over a mask layer; depositing a spacer layer over the first mandrel and the second mandrel; forming a line-end cut pattern over the spacer layer between the first mandrel and the second mandrel; depositing a protection layer over the line-end cut pattern; etching the protection layer and exposing an upper portion of the line-end cut pattern; reducing a width of the line-end cut pattern; etching the spacer layer to expose the first mandrel and the second mandrel; and patterning the mask layer using the etched spacer layer and the reduced line-end cut pattern as an etch mask.

According to an embodiment of the present disclosure, a method of manufacturing a semiconductor device includes: providing a mandrel layer having a first opening; depositing a spacer layer over and along sidewalls of the first opening; forming a first patterned mask over the spacer layer, wherein the first patterned mask comprises a second opening exposing a first portion of the spacer layer; filling the second opening with a sacrificial material; pianarizing the sacrificial material and the first pattered mask; removing the planarized first patterned mask while leaving the sacrificial material in the second opening to form a line-end cut pattern; depositing a protection layer to cover the line-end cut pattern; etching a lateral portion of the protection layer to expose sidewalls of the spacer layer and removing a thickness of the line-end cut pattern; completely removing the protection layer; patterning the spacer layer so that a second portion of the spacer layer remain on sidewalk of the mandrel layer; and forming a second patterned mask by removing the mandrel layer while leaving the line-end cut pattern and the patterned spacer layer According to an embodiment of the present disclosure, a method of manufacturing a semiconductor device includes: patterning a plurality of mandrels over a mask layer; depositing a spacer layer over and along sidewalk of the plurality of mandrels; forming a patterned mask over the spacer layer, the patterned mask comprising an opening exposing a portion of the spacer layer between two adjacent mandrels; depositing a sacrificial material over the patterned mask in the opening; removing the patterned mask thereby forming a line-end cut pattern on the spacer layer; depositing a protection layer to cover the sacrificial material and the spacer layer; performing an isotropic etching on the protection layer to expose the line-end cut pattern; etching sidewalls of the line-end cut pattern; patterning the spacer layer to expose the plurality of mandrels; removing the plurality of mandrels; and patterning the mask layer using sidewall portions of the spacer layer and the etched line-end cut pattern as an etch mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a first mandrel and a second mandrel over a mask layer;
    depositing a spacer layer over the first mandrel and the second mandrel;
    forming a line-end cut pattern over the spacer layer between the first mandrel and the second mandrel;
    depositing a protection layer over the line-end cut pattern;
    etching the protection layer and exposing an upper portion of the line-end cut pattern;
    reducing a width of the line-end cut pattern;
    etching the spacer layer to expose the first mandrel and the second mandrel; and
    patterning the mask layer using the etched spacer layer and the reduced line-end cut pattern as an etch mask.
2. The method of claim 1, wherein forming the line-end cut atte comprises:
    forming a patterned mask over the spacer layer, the patterned mask comprising an opening exposing a portion of the spacer layer between the first mandrel and the second mandrel;
    depositing a sacrificial material in the opening; and
    removing excess portions of the sacrificial material over the opening using a planarization operation.
3. The method of claim 1, wherein the etching of the protection layer is performed by a same operation as that reducing the width of the line-end cut pattern.
4. The method of claim 1, wherein the reducing of the width of the line-end cut pattern also reduces a height of the line-end cut pattern.
5. The method of claim 1, wherein depositing a protection layer over the line-end cut pattern comprises depositing the protection layer to cover an upper surface and sidewalls of the spacer layer.
6. The method of claim 1, wherein etching the protection layer comprises etching sidewalk of the protection layer with a first etch rate and horizontal portions of the protection layer with a second etch rate less than the first etch rate.
7. The method of claim 1, wherein the protection layer comprises at least one of a nitride, an oxide and a carbon-based material.
8. The method of claim 1, wherein the line-end cut pattern comprises titanium oxide, tantalum oxide, silicon oxide, silicon nitride, silicon carbide, or a combination thereof.
9. The method of claim 1, wherein the line-end cut pattern comprises at least one pillar, further comprising patterning a target layer using the patterned mask layer and forming segments of a conductive line in the target layer, wherein a width of the pillar corresponds to a spacing of the segments.
10. The method of claim 1, wherein the line-end cut pattern masks a second horizontal portion of the spacer layer from being etched while the spacer layer is being etched.
11. A method of manufacturing a semiconductor device, comprising:
    providing a mandrel layer having a first opening;
    depositing a spacer layer over and along sidewalls of the first opening;
    forming a first patterned mask over the spacer layer, wherein the first patterned mask comprises a second opening exposing a first portion of the spacer layer;
    filling the second opening with a sacrificial material;
    planarizing the sacrificial material and the first pattered mask;
    removing the planarized first patterned mask while leaving the sacrificial material in the second opening to form a line-end cut pattern;
    depositing a protection layer to cover the line-end cut pattern;
    etching a lateral portion of the protection layer to expose sidewalls of the spacer layer and removing a thickness of the line-end cut pattern;
    completely removing the protection layer;
    patterning the spacer layer so that a second portion of the spacer layer remain on sidewalls of the mandrel layer; and
    forming a second patterned mask by removing the mandrel layer while leaving the line-end cut pattern and the patterned spacer layer.
12. The method of claim 11, wherein the sacrificial material is differentiated from the spacer layer by an etching selectivity of between about 3 and about 10.
13. The method of claim 11, wherein the protection layer is differentiated from the spacer layer by an etching selectivity of between about 3 and about 10.

14. The method of claim 11, wherein the sacrificial material is an inorganic material.

15. The method of claim 11, wherein the line-end cut pattern masks a bottom portion of the spacer layer in the first opening from being etched while the spacer layer is patterned.

16. The method of claim 11, wherein forming a first patterned mask over the spacer layer comprises:
depositing a photoresist stack over the spacer layer; and
forming the second opening through the photoresist stack.

17. The method of claim 16, wherein depositing a photoresist stack over the spacer layer comprises:
depositing a bottom layer over the spacer layer;
depositing a middle layer over the bottom layer;
depositing an upper layer over the middle layer; and
prior to depositing the sacrificial material in the second opening, removing the upper layer.

18. A method comprising:
patterning a plurality of mandrels over a mask layer;
depositing a spacer layer over and along sidewalls of the plurality of mandrels;
forming a patterned mask over the spacer layer, the patterned mask comprising an opening exposing a portion of the spacer layer between two adjacent mandrels;
depositing a sacrificial material over the patterned mask in the opening;
removing the patterned mask thereby forming a line-end cut pattern on the spacer layer;
depositing a protection layer to cover the sacrificial material and the spacer layer;
performing an isotropic etching on the protection layer to expose the line-end cut pattern;
etching sidewalls of the line-end cut pattern;
patterning the spacer layer to expose the plurality of mandrels;
removing the plurality of mandrels; and
patterning the mask layer using sidewall portions of the spacer layer and the etched line-end cut pattern as an etch mask.

19. The method of claim 18, further comprising completely removing the protection layer prior to patterning the spacer layer.

20. The method of claim 18, wherein depositing the sacrificial material comprises depositing the sacrificial material at about 200° C. or below.

* * * * *